(12) United States Patent
Hayashi

(10) Patent No.: US 10,043,739 B2
(45) Date of Patent: Aug. 7, 2018

(54) SEMICONDUCTOR DEVICE AND LEADFRAME

(71) Applicant: SHINKO ELECTRIC INDUSTRIES CO., LTD., Nagano (JP)

(72) Inventor: Shintaro Hayashi, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 15/290,100

(22) Filed: Oct. 11, 2016

(65) Prior Publication Data

US 2017/0125328 A1    May 4, 2017

(30) Foreign Application Priority Data

Oct. 30, 2015  (JP) .................. 2015-214850

(51) Int. Cl.
*H01L 23/495*     (2006.01)
*H01L 23/498*     (2006.01)
*H01L 21/48*      (2006.01)
*H01L 21/56*      (2006.01)
*H01L 23/00*      (2006.01)

(52) U.S. Cl.
CPC .... *H01L 23/49805* (2013.01); *H01L 21/4828* (2013.01); *H01L 21/4842* (2013.01); *H01L 21/56* (2013.01); *H01L 23/49503* (2013.01); *H01L 23/49548* (2013.01); *H01L 23/49558* (2013.01); *H01L 24/48* (2013.01); *H01L 2224/451* (2013.01); *H01L 2224/45144* (2013.01); *H01L 2224/45147* (2013.01); *H01L 2224/48091* (2013.01); *H01L 2224/48101* (2013.01); *H01L 2224/48249* (2013.01); *H01L 2924/00014* (2013.01)

(58) Field of Classification Search
CPC ............ H01L 23/495; H01L 23/49505
USPC ................................ 257/666; 438/123
See application file for complete search history.

(56) References Cited

U.S. PATENT DOCUMENTS 6,274,927 B1 *  8/2001  Glenn ............... H01L 23/10
                                          257/680
8,736,037 B2 *  5/2014  Powell .............. H01L 21/4832
                                          257/666

(Continued)

FOREIGN PATENT DOCUMENTS

JP      2001-024135       1/2001

*Primary Examiner* — David Vu
*Assistant Examiner* — Brandon Fox
(74) *Attorney, Agent, or Firm* — IPUSA, PLLC

(57) ABSTRACT

A semiconductor device includes a leadframe, a semiconductor chip mounted on the leadframe, and an encapsulation resin covering the leadframe and the semiconductor chip. The leadframe includes a terminal having a pillar shape. The terminal includes a first end surface, a second end surface facing away from the first end surface, and a side surface extending vertically between the first end surface and the second end surface. The side surface is stepped to form a step surface facing away from the second end surface and having an uneven surface part formed therein. A first portion of the terminal extending from the first end surface toward the second end surface and including the step surface is covered with the encapsulation resin. A second portion of the terminal extending from the first portion to the second end surface projects from the encapsulation resin.

10 Claims, 30 Drawing Sheets

(56) References Cited

U.S. PATENT DOCUMENTS

| | | | |
|---|---|---|---|
| 2003/0164535 A1* | 9/2003 | Inatsugu | H01L 21/4842 257/666 |
| 2004/0159918 A1* | 8/2004 | Lee | H01L 23/3107 257/670 |
| 2007/0059863 A1* | 3/2007 | Li | H01L 21/4832 438/113 |
| 2008/0258278 A1* | 10/2008 | Ramos | H01L 24/40 257/676 |
| 2009/0039486 A1* | 2/2009 | Shimazaki | H01L 21/561 257/676 |
| 2011/0227208 A1* | 9/2011 | Kim | H01L 21/4832 257/676 |

* cited by examiner

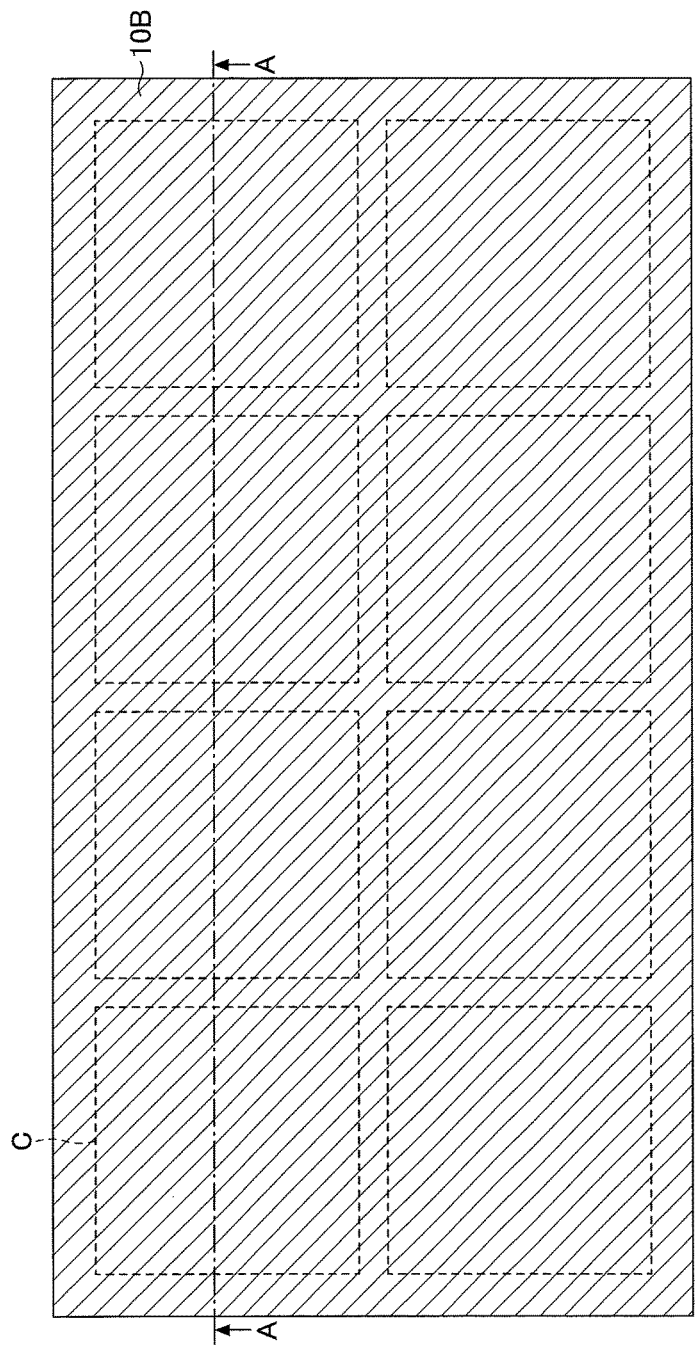
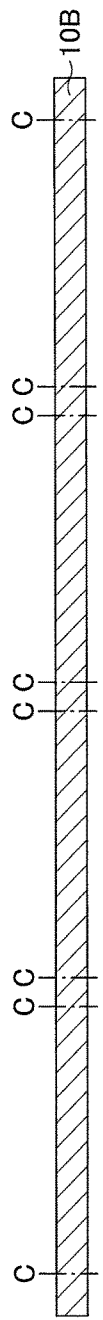
FIG.3A
FIG.3B

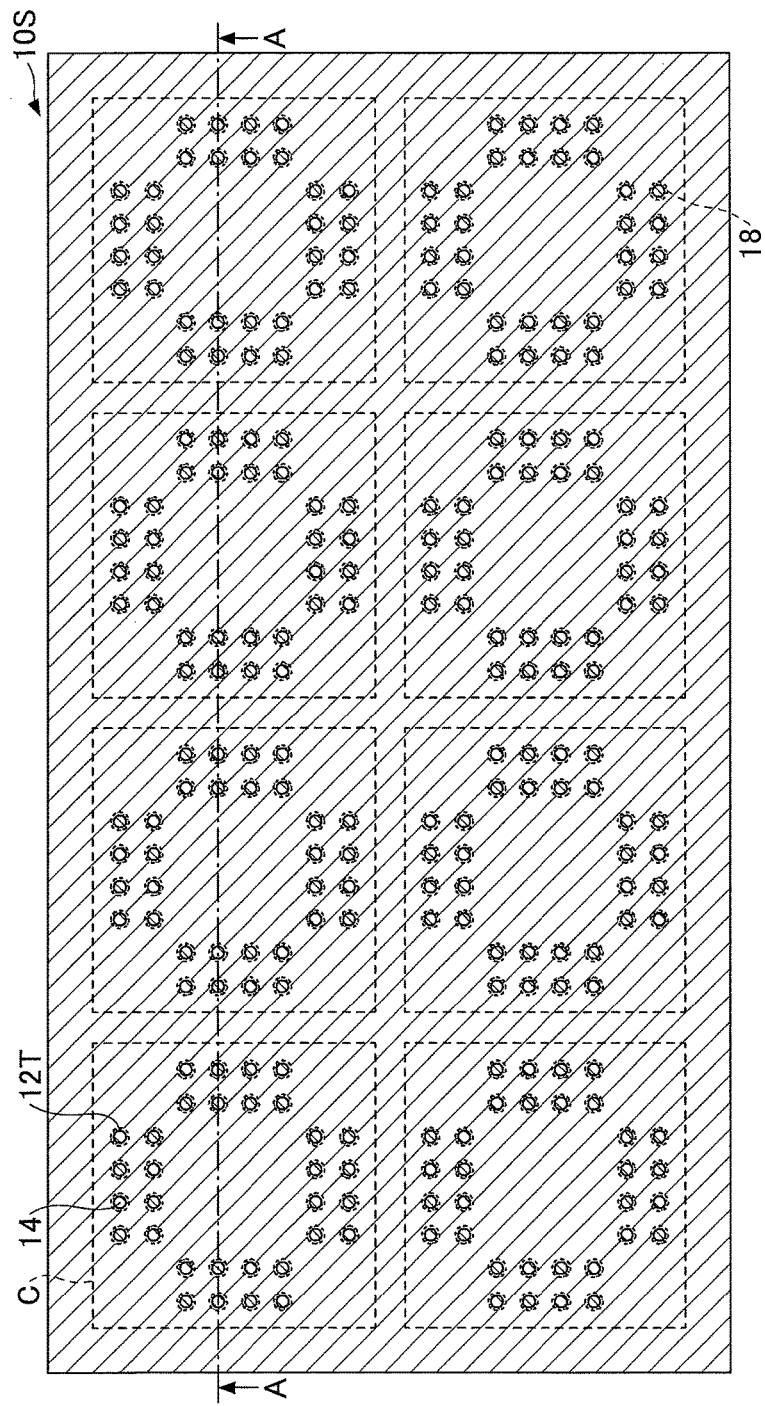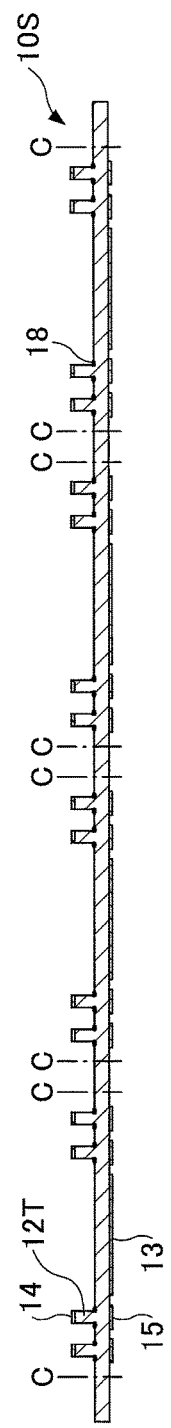
FIG.8A
FIG.8B

SEMICONDUCTOR DEVICE AND LEADFRAME

CROSS-REFERENCE TO RELATED APPLICATION

This application is based upon and claims the benefit of priority of the prior Japanese Patent Application No. 2015-214850, filed on Oct. 30, 2015, the entire contents of which are incorporated herein by reference.

FIELD

A certain aspect of the embodiments discussed herein is related to semiconductor devices and leadframes.

BACKGROUND

Semiconductor devices in which a semiconductor chip is mounted on a leadframe and encapsulated in resin are known. Examples of such semiconductor devices include a semiconductor device in which a cylindrical or prismatic terminal has one end portion encapsulated in resin and the other end portion projects from the resin. According to this semiconductor device, one end of the terminal is connected to a semiconductor chip with a bonding wire and the other end of the terminal is covered with a plating film to be available for external connection. In the process of manufacturing this semiconductor device, the terminal is formed by etching a metal plate from its lower surface. Reference may be made to Japanese Laid-open Patent Publication No. 2001-24135 for related art.

SUMMARY

According to an aspect of the present invention, a semiconductor device includes a leadframe, a semiconductor chip mounted on the leadframe, and an encapsulation resin covering the leadframe and the semiconductor chip. The leadframe includes a terminal having a pillar shape. The terminal includes a first end surface, a second end surface facing away from the first end surface, and a side surface extending vertically between the first end surface and the second end surface. The side surface is stepped to form a step surface facing away from the second end surface and having an uneven surface part formed therein. A first portion of the terminal extending from the first end surface toward the second end surface and including the step surface is covered with the encapsulation resin. A second portion of the terminal extending from the first portion to the second end surface projects from the encapsulation resin.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIGS. 3A and 3B are diagrams depicting a process of manufacturing a semiconductor device according to the first embodiment;

FIGS. 8A and 8B are diagrams depicting the process of manufacturing a semiconductor device according to the first embodiment;

DESCRIPTION OF EMBODIMENTS

Figure 1A:
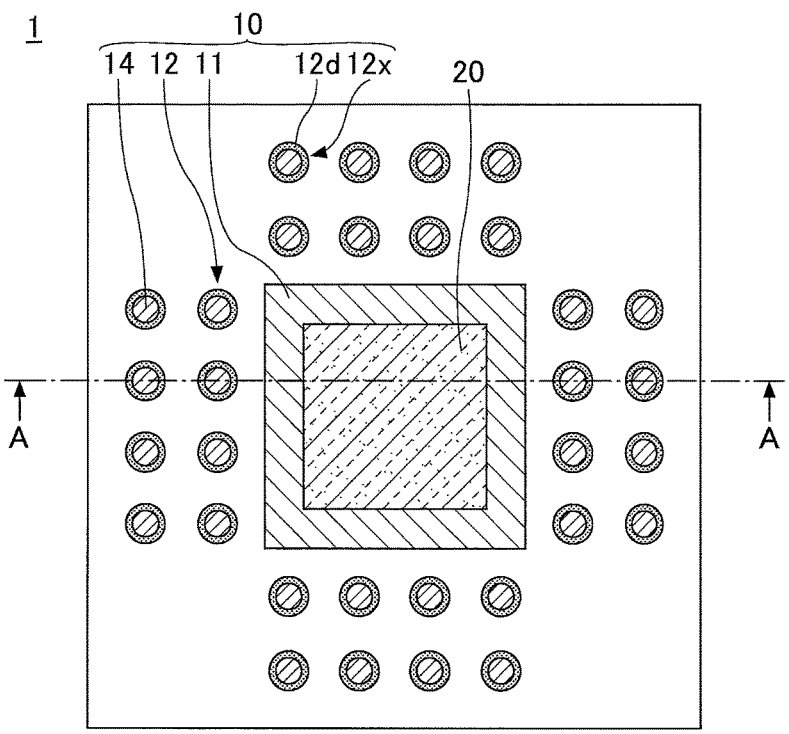
FIGS. 1A through 1D are diagrams depicting a semiconductor device according to a first embodiment.

As described above, there is a semiconductor device in which a metal plate is etched from its lower surface to form a terminal. In this case, however, it is not possible to provide the terminal with an "anchor", which is a structure for preventing the terminal from coming off of resin. Accordingly, the terminal may come off of resin.

According to an aspect of the present invention, a semiconductor device in which a terminal is less likely to come off of resin is provided.

Embodiments of the present invention are described below with reference to the accompanying drawings. In the drawings, the same element is referred to using the same reference numeral, and a repetitive description thereof may be omitted.

[a] First Embodiment

Figure 1B:
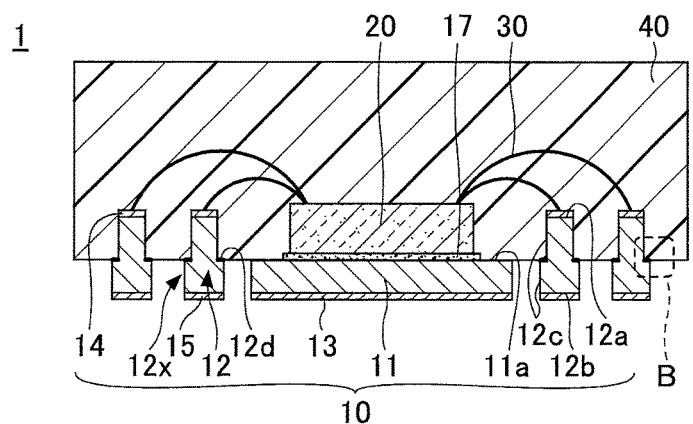
Figure 1C:
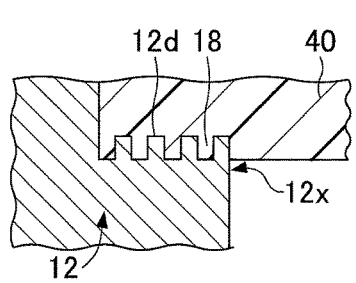
Figure 1D:
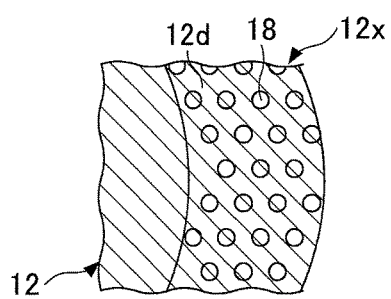

First, a structure of a semiconductor device according to a first embodiment is described. FIG. 1A is a plan view of a semiconductor device according to the first embodiment. FIG. 1B is a cross-sectional view of the semiconductor device, taken along a line A-A in FIG. 1A. FIG. 1C is an enlarged cross-sectional view of a part indicated by B ("part B") in FIG. 1B. FIG. 1D is an enlarged plan view of part of the part B in FIG. 1B. In FIG. 1A, metal wires 30 and resin 40 are not depicted for clarity. In FIG. 1D, the resin 40 is not depicted for clarity.

Referring to FIGS. 1A through 1D, a semiconductor device 1 includes a leadframe 10, a semiconductor chip 20, the metal wires 30 (bonding wires), and the resin 40.

According to this embodiment, for convenience of description, the semiconductor chip 20 side of the semiconductor device 1 will be referred to as "upper side" or "first side," and the leadframe 10 side of the semiconductor device 1 will be referred to as "lower side" or "second side." Furthermore, with respect to each part or element of the semiconductor device 1, a surface on the semiconductor chip 20 side will be referred to as "upper surface" or "first surface," and a surface on the leadframe 10 side will be referred to as "lower surface" or "second surface." The semiconductor device 1, however, may be used in an inverted position or oriented at any angle. Furthermore, a plan view refers to a view of an object taken in a direction normal to the first surface of the leadframe 10, and a planar shape refers to the shape of an object viewed in a direction normal to the first surface of the leadframe 10.

According to the semiconductor device 1, the leadframe 10 includes a die pad 11 (a chip mounting part) on which the semiconductor chip 20 is mounted, and leads 12 (terminals). Suitable materials for the leadframe 10 include, for example, metal materials, such as copper (Cu), copper alloys, and alloy 42 (an iron-nickel [Fe—Ni] alloy).

An upper surface 11a of the die pad 11 (except for a region on which the semiconductor chip 20 is mounted) is covered with the resin 40. The side surfaces and the lower surface of the die pad 11 are not covered with the resin 40 to be exposed. A metal film 13 is formed on the lower surface of the die pad 11. Examples of the metal film 13 include a silver (Ag) film, a gold (Au) film, a Ni/Au film (a laminated metal film of a Ni film and a Au film stacked in this order), and a Ni/Pd/Au film (a laminated metal film of a Ni film, a palladium [Pd] film, and a Au film stacked in this order).

The leads 12 are electrically independent of the die pad 11, and are provided around the die pad 11 with a predetermined pitch in a plan view. The leads 12 do not have to be provided in two rows, and may be provided in a single row or three or more rows, around the die pad 11. The leads 12 may be provided on only two opposite sides among the four sides of the die pad 11. The leads 12 may be hereinafter collectively referred to as "lead 12" when features common to the leads 12 are described.

The lead 12 has a substantially cylindrical shape. The lead 12 has an upper surface 12a at an upper end, a lower surface 12b at a lower end, and a side surface (peripheral surface) 12c vertically extending between the upper surface 12a and the lower surface 12b. The lead 12 includes a stepped part 12x where the side surface 12c is stepped to form an upper portion (on the upper surface 12a side) and a lower portion (on the lower surface 12b side) that is radially (laterally) outside the upper portion. The stepped part 12x includes a step surface 12d having a substantially annular planar shape. That is, the side surface 12c is stepped to form the step surface 12d that faces upward, namely, away from the lower surface 12b. The stepped part 12x refers to a portion of the lead 12 including the step surface 12d and its vicinity.

The diameter (area) of the lower surface 12b of the lead 12 is greater than the diameter (area) of the upper surface 12a of the lead 12. The diameter of the upper surface 12a may be, for example, approximately 0.2 mm to approximately 0.25 mm. The width (annular width) of the step surface 12d may be, for example, approximately 50 µm to approximately 75 µm.

A metal film 14 is formed on the upper surface 12a of the lead 12. A metal film 15 is formed on the lower surface 12b of the lead 12. The metal film 15 is formed to cover a position (region) that coincides with the upper surface 12a and the step surface 12d of the lead 12 in a plan view. The lower surface of the metal film 15 may be substantially flush with the lower surface of the metal film 13 formed on the lower surface of the die pad 11. Examples of the metal films 14 and 15 include a Ag film, a Au film, a Ni/Au film, and a Ni/Pd/Au film. The metal film 13 formed on the lower surface of the die pad 11 and the metal films 14 and 15 formed on the upper surface 12a and the lower surface 12b, respectively, of the lead 12, which are referred to using different reference numerals for convenience of description, may be formed of the same material in the same process.

The semiconductor chip 20 is mounted face up on the die pad 11. The semiconductor chip 20 may be mounted on the die pad 11 through an adhesive 17 such as a die attach film (a die bonding process). As the adhesive 17, adhesive paste may be used in lieu of an adhesive film such as a die attach film. Each of electrode terminals at the upper surface of the semiconductor chip 20 is electrically connected (wire-bonded) to the metal film 14 formed on the upper surface 12a of the lead 12 via one of the metal wires 30, such as gold or copper wires.

The resin 40 is an encapsulation resin that covers the semiconductor chip 20, the metal wires 30, and part of the leadframe 10. That is, the resin 40 encapsulates the semiconductor chip 20, the metal wires 30, and part of the leadframe 10 to expose the die pad 11 and part of the lead 12. An upper end portion of the lead 12, extending from the step surface 12d to the upper surface 12a, is buried in and covered with the resin 40. A lower end portion of the lead 12, extending from the step surface 12d to the lower surface 12b, projects from the resin 40. The lower end portion of the lead 12 serves as an external connection terminal. The step surface 12d is covered with the resin 40. The resin 40 may be, for example, a so-called mold resin that is epoxy resin containing a filler.

Referring to FIGS. 1C and 1D, an uneven surface part 18 is formed in the step surface 12d of the lead 12. The step surface 12d contacts the resin 40. A region in which the uneven surface part 18 is provided is schematically indicated by a dotted pattern in FIG. 1A and by a thick line in FIG. 1B.

The uneven surface part 18 is, for example, where fine depressions (dimples) having a substantially circular planar shape are vertically and laterally arranged at high density. The uneven surface part 18 may have depressions regularly arranged. For example, the uneven surface part 18 may have depressions arranged like a lattice such as a face-centered lattice.

The diameter of the depressions is preferably 0.020 mm to 0.060 mm, and more preferably, 0.020 mm to 0.040 mm. The pitch of the depressions is preferably 0.040 mm to 0.080 mm. The depth of the depressions is preferably approximately 35% to approximately 70% of the thickness of the leadframe 10, and may be, for example, approximately 0.010 mm to approximately 0.050 mm.

According to the uneven surface part 18, the planar shape of the depressions is not limited to a substantial circle, and may be, for example, a polygon such as a hexagon. In this case, the diameter of the circumcircle of a polygon is preferably 0.020 mm to 0.060 mm, and more preferably, 0.020 mm to 0.040 mm. The pitch of the circumcircles is preferably 0.040 mm to 0.080 mm.

Figure 2:
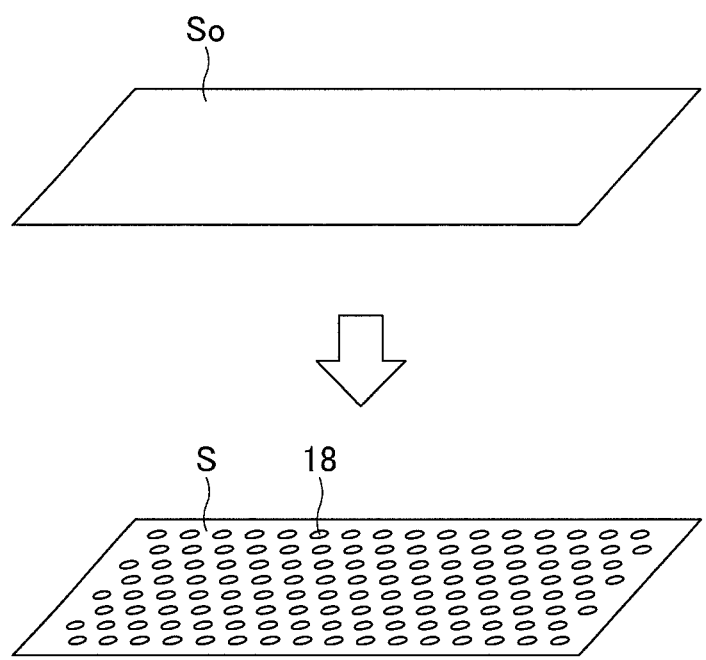
FIG. 2 is a diagram illustrating an S ratio.

According to embodiments of the present invention, the term "uneven surface part" refers to a part where the planar shape of depressions formed in a surface is a circle whose diameter is greater than or equal to 0.020 mm and smaller than or equal to 0.060 mm or a polygon whose circumcircle has a diameter of greater than or equal to 0.020 mm and smaller than or equal to 0.060 mm, and the S ratio of the part (uneven surface part) is 1.7 or more. Here, the S ratio refers to the ratio of S to S0, where S0 is the surface area of a planar surface and S is the surface area of the uneven surface part formed in the planar surface as depicted in FIG. 2. That is, the S ratio is S/S0. A surface of the uneven surface part may be plated with, for example, silver. In this case, S is the area of the plated surface of the uneven surface part.

If the diameter of the depressions or the diameter of the circumcircle of the polygon is smaller than 0.020 mm or greater than 0.060 mm, it is difficult to increase the S ratio, so that adhesion to resin does not increase.

By thus providing the lead 12 with the stepped part 12x and providing the uneven surface part 18 in the step surface 12d of the stepped part 12x, the surface area of the contact (interface) between the lead 12 and the resin 40 increases to produce the anchoring effect, thus making it possible to increase the adhesion between the lead 12 and the resin 40. As a result, it is possible to reduce the possibility that the lead 12 may come off of the resin 40.

Furthermore, according to conventional cylindrical or prismatic leads, moisture may enter the interface between resin and the side surface of a lead to move deeper along the interface. The moisture entering the interface between resin and the side surface of a lead may cause the problem (a so-called popcorn phenomenon) that the moisture suddenly expands and vaporizes to generate a crack in the resin during a reflow process or the like when a semiconductor device is mounted on a mounting board. The popcorn phenomenon occurs to break the semiconductor device.

According to the semiconductor device 1, the lead 12 is provided with the stepped part 12x and the uneven surface part 18 is provided in the step surface 12d of the stepped part 12x. Therefore, it is possible to make the entry pathway of moisture substantially longer to reduce the possibility that moisture may enter the interface between the side surface 12c of the lead 12 and the resin 40 to move deeper along the interface. As a result, it is possible to reduce the possibility of occurrence of the popcorn phenomenon.

Next, a method of manufacturing a semiconductor device according to the first embodiment is described. FIGS. 3A through 9C are diagrams depicting a process of manufacturing a semiconductor device according to the first embodiment.

First, in the process depicted in FIGS. 3A and 3B, a metal plate 10B ("plate 10B") (a plate member) having a predetermined shape is prepared. FIG. 3A is a plan view of the plate 10B. FIG. 3B is a cross-sectional view of the plate 10B, taken along a line A-A in FIG. 3A. The plan view of FIG. 3A is provided with hatching lines corresponding to those in the cross-sectional view of FIG. 3B to facilitate understanding of the drawings. The plate 10B is ultimately cut along scribe lines indicated by a dashed line into multiple individual regions C that become leadframes 10 (see FIGS. 1A through 1D). Suitable materials for the plate 10B include, for example, metal materials, such as copper, copper alloys, and alloy 42. The thickness of the plate 10B may be, for example, approximately 100 µm to approximately 200 µm.

Next, in the process depicted in FIGS. 4A through 4D, a photoresist 300 ("resist 300") and a photoresist 310 ("resist 310") are formed on an upper surface 10Ba and a lower surface 10Bb, respectively, of the plate 10B. Then, the resist 300 is exposed to light and developed to form openings 300x and 300y at predetermined positions in the resist 300.

Referring to FIGS. 4A through 4D, the opening 300x is an opening for forming a part to become the die pad 11 and a part to become the leads 12 in the plate 10B. Furthermore, the openings 300y are openings for forming the stepped parts 12x of the leads 12, and are, for example, multiple circular openings that are vertically and laterally arranged. The diameter of the circular openings may be, for example, 0.020 mm to 0.040 mm. The pitch of the circular openings may be, for example, 0.040 mm to 0.080 mm. The planar shape of the openings 300y is not limited to a circle, and may be, for example, a polygon such as a hexagon. In this case, the diameter of the circumcircle of a polygon may be, for example, 0.020 mm to 0.040 mm, and the pitch of the polygons may be, for example, 0.040 mm to 0.080 mm.

Figure 4A:
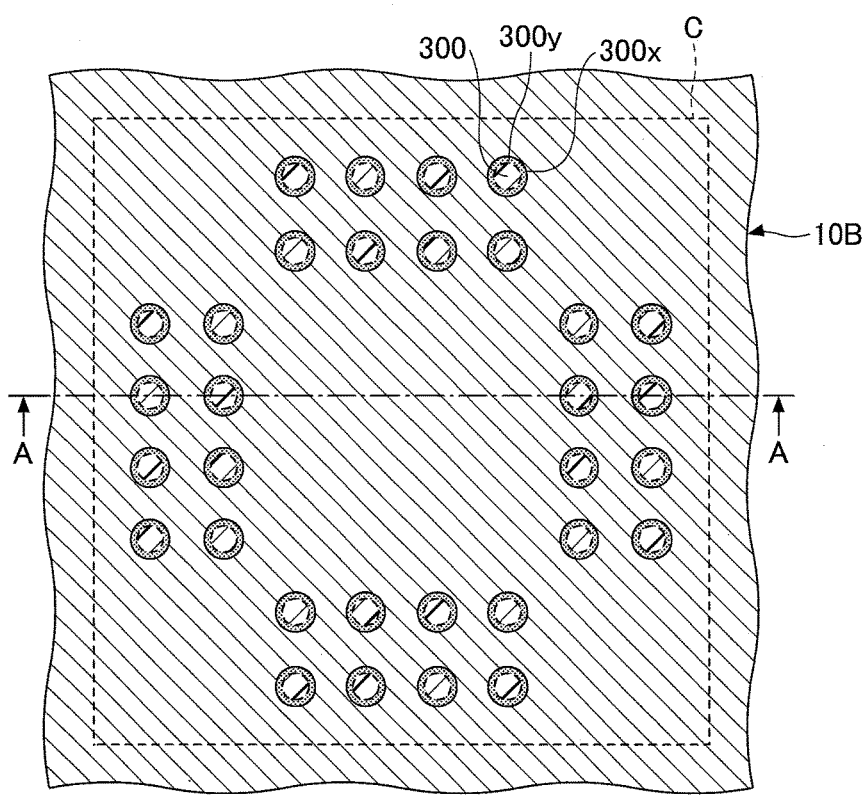
FIGS. 4A through 4D are diagrams depicting the process of manufacturing a semiconductor device according to the first embodiment.
Figure 4B:
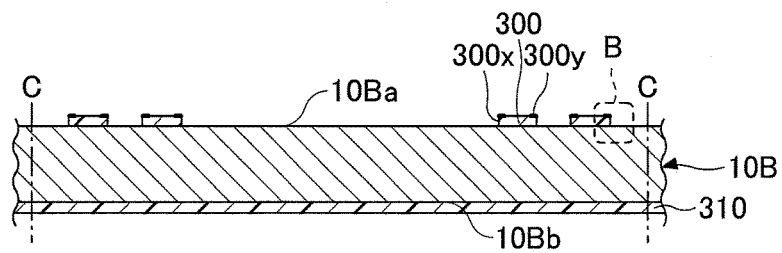
Figure 4C:
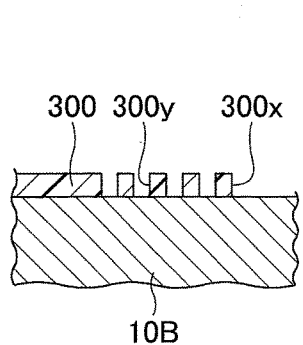
Figure 4D:
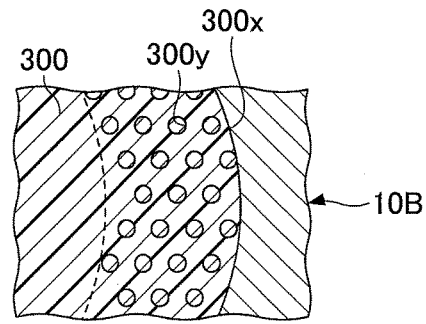

FIG. 4A is a plan view of one of the individual regions C of FIGS. 3A and 3B. FIG. 4B is a cross-sectional view of one of the individual regions C, taken along a line A-A in FIG. 4A. FIG. 4C is an enlarged cross-sectional view of a part indicated by B ("part B") in FIG. 4B. FIG. 4D is an enlarged plan view of part of the part B in FIG. 4B. The plan views of FIGS. 4A and 4D are provided with hatching lines corresponding to those in the cross-sectional view of FIG. 4B to facilitate understanding of the drawings. Furthermore, a region in which the openings 300y for forming the stepped parts 12x are provided is schematically indicated by a dotted pattern in FIG. 4A and by a thick line in FIG. 4B. The same is the case with FIGS. 5A, 5B, 5C and 5D and FIGS. 6A, 6B, 6C and 6D. The following description is given with respect to one of the individual regions C as a typical example of the individual regions C.

Next, in the process depicted in FIGS. 5A through 5D, the resists 300 and 310 are used as etching masks to perform etching (such as wet etching) on the plate 10B. Where the opening 300X is formed, the plate 10B is half-etched to reduce the thickness of a part of the plate 10B to become the die pad 11, and to form pillar-shaped projections 12T to become the leads 12 at the upper surface 10Ba of the plate 10B. The projections 12T may be vertically elongated to be shaped like a pillar. As a result a leadframe 10S is formed. For example, the plate 10B may be etched so that the thickness of the part to become the die pad 11 may be reduced to approximately 70% of the thickness of the plate 10B before etching. According to this embodiment, the projections 12T have a cylindrical shape. Alternatively, the projections 12T may have the shape of a prism such as a quadrangular prism or a hexagonal prism (see the variations described below).

In a part of the plate 10B over which the openings 300y are formed, the plate 10B is partly prevented from being etched at the beginning of etching because the entry of an etchant is restricted around each circular opening (where the resist 300 is formed). Thereafter, from the middle to the end of etching, the etchant enters the plate 10B through the periphery of each opening to corrode the entire part of the plate 10B over which the openings 300y are formed. As a result, openings shallower at the peripheral edge than in the center are etched in the part of the plate 10B. The etched openings are depressions, depressed relative to their periphery, having a circular planar shape. As a result, the uneven surface part 18 is formed, and the entire part of the plate 10B over which the openings 300y are formed is reduced in thickness.

Figure 5A:
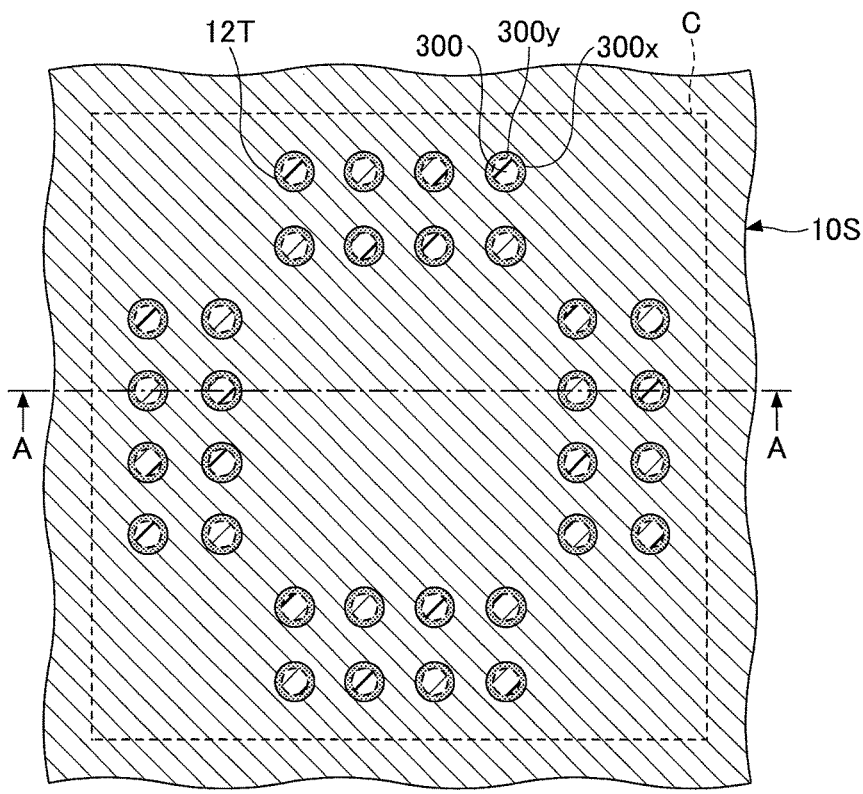
FIGS. 5A through 5D are diagrams depicting the process of manufacturing a semiconductor device according to the first embodiment.
Figure 5B:
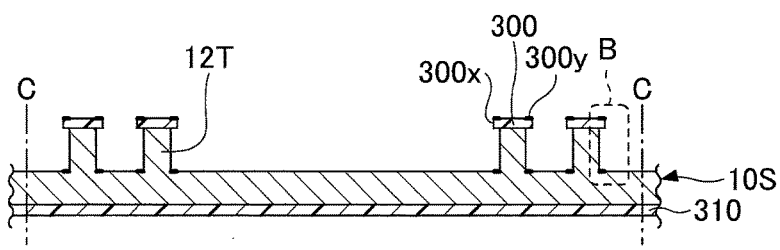
Figure 5C:
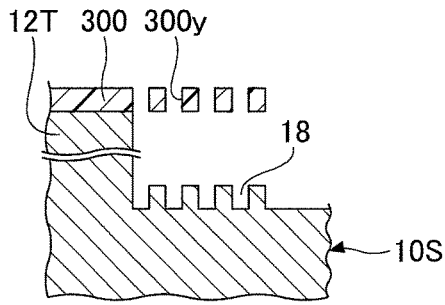
Figure 5D:
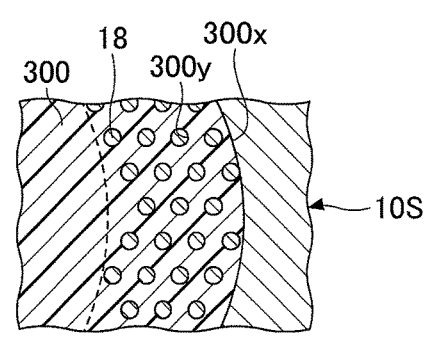
Figure 6A:
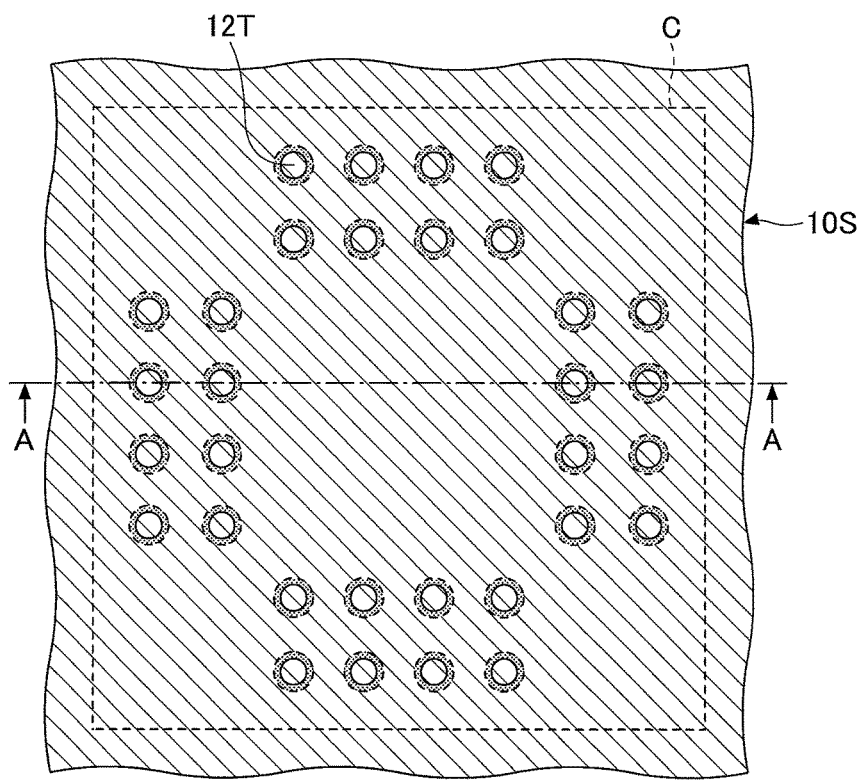
FIGS. 6A through 6D are diagrams depicting the process of manufacturing a semiconductor device according to the first embodiment.
Figure 6B:
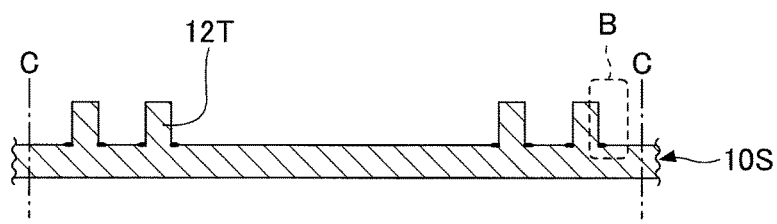
Figure 6C:
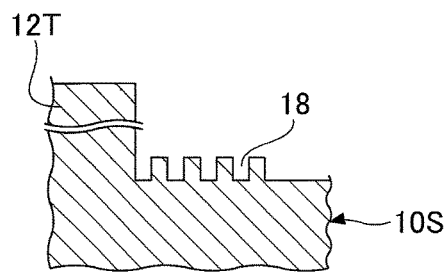
Figure 6D:
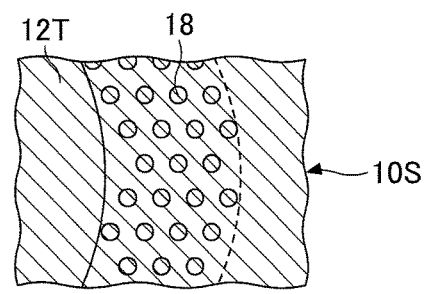

One or more of the planar shape, the size, and the pitch of the openings 300y may be changed to vary the shape and the depth of the depressions of the uneven surface part 18. Furthermore, by changing one or more of the planar shape, the size, and the pitch of the openings 300y, the amount of etching changes, and therefore, the thickness of the plate 10B can be reduced to a desired value. According to this embodiment, the planar shape, the size, and the pitch of the openings 300y are determined to make the part of the plate 10B over which the openings 300y are formed approximately as thick as the part of the plate 10B over which the opening 300x is formed. Therefore, the deepest part of each depression of the uneven surface part 18 is substantially level with the upper surface of a part of the leadframe 10S to become the die pad 11. Referring to FIG. 5C, depressions of the uneven surface part 18 are depicted as having a rectangular cross section, while the depressions are practically formed to have a concave cross section whose bottom curves downward (inward).

Next, in the process depicted in FIGS. 6A through 6D, the resists 300 and 310 depicted in FIGS. 5A through 5D are removed. Next, in the process depicted in FIG. 7A, a photoresist 320 ("resist 320") is formed on the upper surface of the leadframe 10S including the upper surfaces and side surfaces of the projections 12T, and a photoresist 330 ("resist 330") is formed on the lower surface of the leadframe 10S. The resists 320 and 330 are exposed to light and developed to form openings 320x in the resist 320 and openings 330x and 330y in the resist 330. The openings 320x are formed to expose the upper surfaces of the projections 12T. The opening 330x is formed to expose the part of the leadframe 10S to become the die pad 11.

Furthermore, the openings 330y (which may be hereinafter collectively referred to as "opening 330y") are formed to expose part of the lower surface of the leadframe 10S that coincides with the upper surfaces of the projections 12T and regions in which the uneven surface part 18 is formed (hereinafter collectively referred to as "formation region of the uneven surface part 18") in a plan view. That is, when the formation region of the uneven surface part 18 has an annular shape and an outside diameter $\phi 1$ in a plan view, circular openings whose diameter is $\phi 1$ are formed as the openings 330y. The perimeter of the opening 330y does not have to exactly match the perimeter of the formation region of the uneven surface part 18. For example, the opening 330y may be formed to lie over only part of the circular ring of the uneven surface part 18 in a plan view. Alternatively, as described below in a third embodiment, the diameter of the opening 330y may be greater than the outside diameter of the formation region of the uneven surface part 18.

Figure 7A:
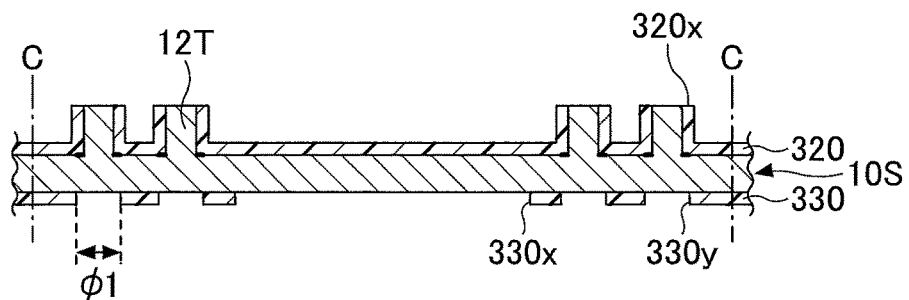
FIGS. 7A through 7C are diagrams depicting the process of manufacturing a semiconductor device according to the first embodiment.
Figure 7B:
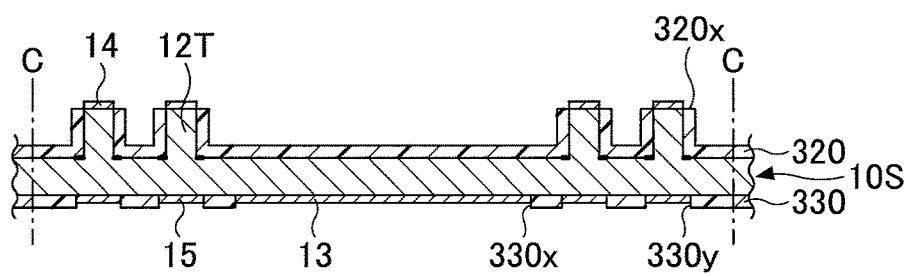

Next, in the process depicted in FIG. 7B, the metal film 14 is formed on the upper surfaces of the projections 12T exposed in the opening 302x, and the metal film 13 is formed on the lower surface of a region of the leadframe 10S to become the die pad 11, exposed in the opening 330x. Furthermore, the metal film 15 is formed on the lower surface of a part of the leadframe 10S to become the leads 12, exposed in the openings 330y. The metal film 15 is formed to cover part of the lower surface of the leadframe 10S that coincides with the upper surfaces of the projections 12T and the formation region of the uneven surface part 18 in a plan view.

Examples of the metal films 13, 14 and 15 include a Ag film, a Au film, a Ni/Au film, and a Ni/Pd/Au film. The metal films 13, 14 and 15 may be formed by, for example, electroplating, using the leadframe 10S as a power feed path.

Figure 7C:
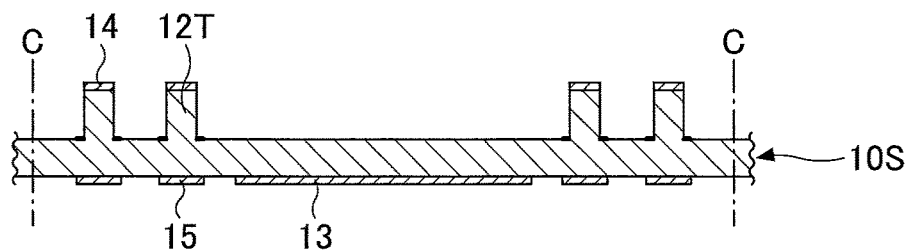

Next, in the process depicted in FIG. 7C, the resists 320 and 330 depicted in FIG. 7B are removed. As a result, the leadframe 10S is completed to have a planar shape as depicted in FIGS. 8A and 8B.

According to the leadframe 10S depicted in FIGS. 8A and 8B, the individual regions C to become leadframes 10 are arranged in a matrix in a metal plate. The projections 12T to become external connection terminals and a chip mounting region on which a semiconductor chip is to be mounted are formed at the upper surface of each individual region C. The chip mounting region is a region surrounded by the projections 12T in the upper surface of each individual region C. Furthermore, the uneven surface part 18 is formed around each projection 12T in the upper surface of each individual region C. The upper surface of each individual region C including the formation region of the uneven surface part 18 is a covered region to be covered with the resin 40.

The description goes on to describe a process of manufacturing the semiconductor device 1. First, in the process depicted in FIG. 9A, the semiconductor chip 20 is mounted face up on a part of each individual region C to become the die pad 11. The semiconductor chip 20 may be mounted on the part to become the die pad 11 through the adhesive 17 such as a die attach film (a die bonding process). In this case, the die attach film is heated to a predetermined temperature to be hardened. As the adhesive 17, adhesive paste may be used in lieu of an adhesive film such as a die attach film. Electrode terminals formed at the upper surface of the semiconductor chip 20 are electrically connected to the metal film 14 via the metal wires 30, such as gold or copper wires. The metal wires 30 may be connected to the electrode terminals of the semiconductor chip 20 and the metal film 14 by, for example, wire bonding.

Figure 9A:
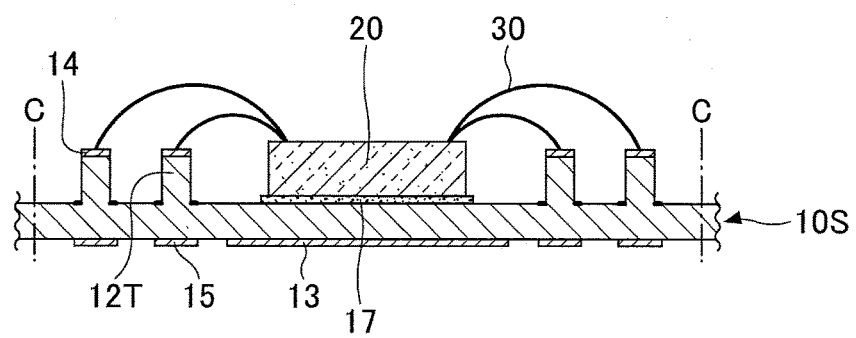
FIGS. 9A through 9C are diagrams depicting the process of manufacturing a semiconductor device according to the first embodiment.
Figure 9B:
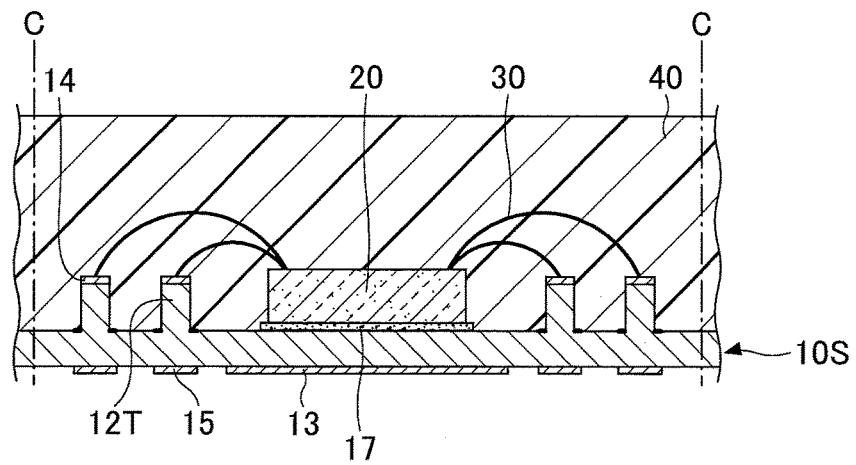

Next, in the process depicted in FIG. 9B, the leadframe 10S, the semiconductor chip 20, and the metal wires 30 are encapsulated in the resin 40 by, for example, transfer molding or compression molding. The resin 40 may be, for example, a so-called mold resin that is epoxy resin containing a filler.

Figure 9C:
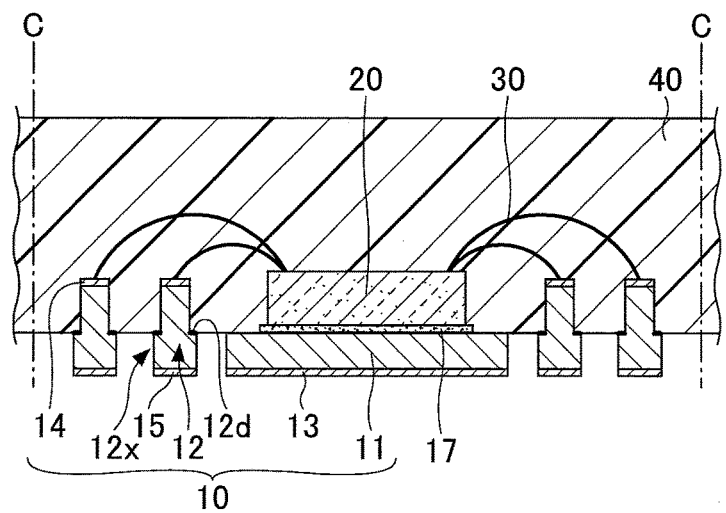

Next, in the process depicted in FIG. 9C, the leadframe 10S is etched from its lower surface (by, for example, wet etching). At this point, an etchant that can selectively etch the leadframe 10S (such as copper) without removing the metal films 13 and 15 (such as Ni/Pd/Au plating films) may be selected to cause the metal films 13 and 15 to serve as etching masks. Therefore, only a portion of the leadframe 10S on which the metal film 13 or 15 is not formed is etched, so that the die pad 11 and the leads 12 are independently formed to project from the lower surface of the resin 40, thus forming the leadframe 10 (an etchback process).

Thereafter, the structure depicted in FIG. 9C is cut along scribe lines into the individual regions C to complete semiconductor devices 1 (see FIGS. 1A through 1D). A slicer or the like may be used to cut the structure depicted in FIG. 9C.

The semiconductor devices 1 may be shipped as individual products. Alternatively, the leadframe 10S before singulation as depicted in FIGS. 8A and 8B may be shipped as a single product. In this case, a person who acquires the leadframe 10S before singulation may execute the processes depicted in FIGS. 9A through 9C to manufacture the semiconductor devices 1.

Thus, according to the manufacturing process of the leadframe 10S, a predetermined pattern for forming the uneven surface part 18 is formed in an etching mask that is used to etch a plate to form the projections 12T, etc. Therefore, it is possible to form the uneven surface part 18 in the same process as the projections 12T, etc., are formed. Accordingly, it is possible to streamline the manufacturing process and reduce the manufacturing cost.

Furthermore, it is possible to form the projections 12T, etc., and the uneven surface part 18 simultaneously using a single etching mask. Accordingly, in principle, there is no misplacement of the projections 12T, etc., and the uneven surface part 18 relative to each another. Accordingly, it is possible to form the uneven surface part 18 at desired positions relative to the projections 12T, etc.

According to a conventional technique that performs etching for surface roughening separately from the etching for forming the projections 12T, etc., the manufacturing process becomes complicated to increase cost, and the position accuracy of roughened regions deteriorates.

[b] Second Embodiment

A second embodiment is different from the first embodiment in the position of a step surface. In the second embodiment, a description of the same configurations as those of the above-described embodiment may be omitted.

Figure 10A:
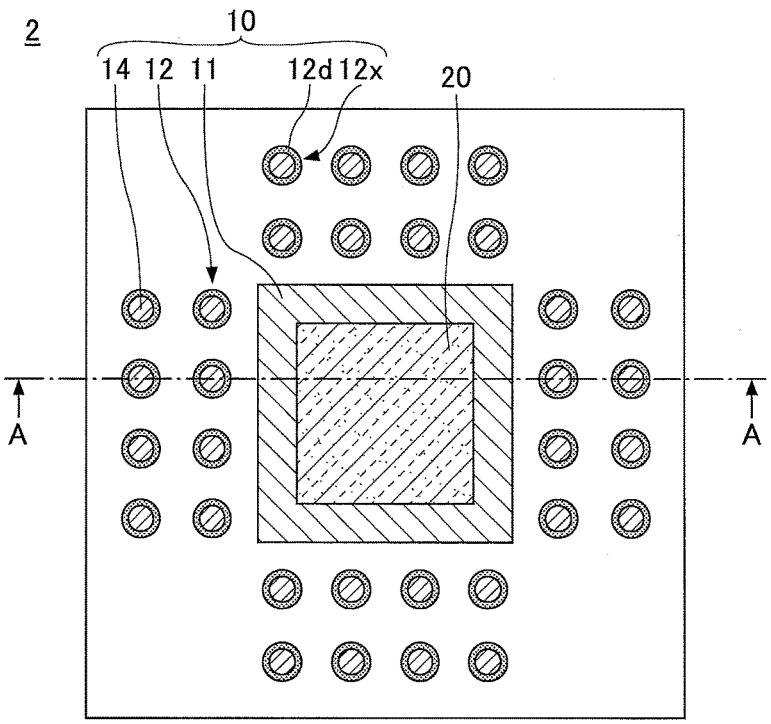
FIGS. 10A through 10D are diagrams depicting a semiconductor device according to a second embodiment.
Figure 10B:
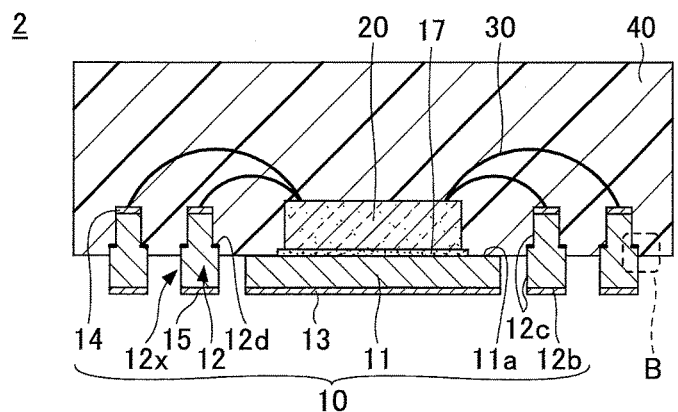
Figure 10C:
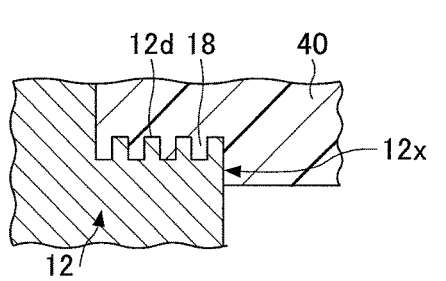
Figure 10D:
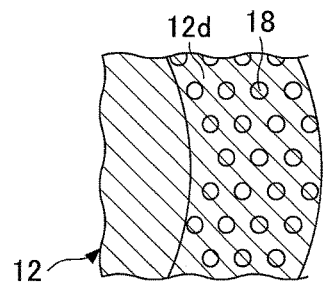
Figure 11A:
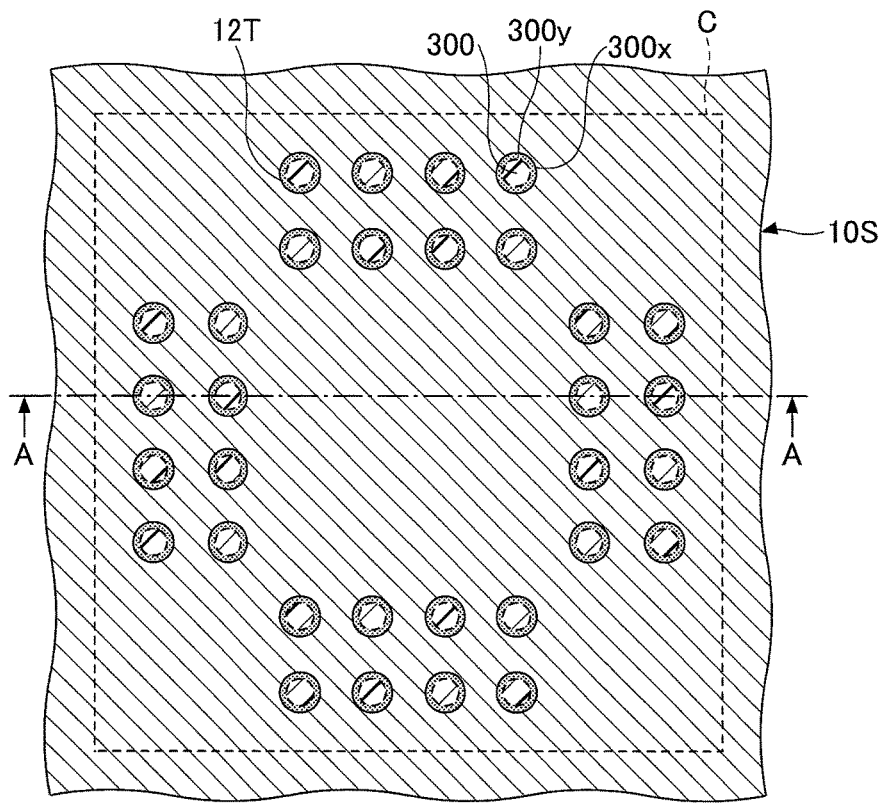
FIGS. 11A through 11D are diagrams depicting a process of manufacturing a semiconductor device according to the second embodiment.
Figure 11B:
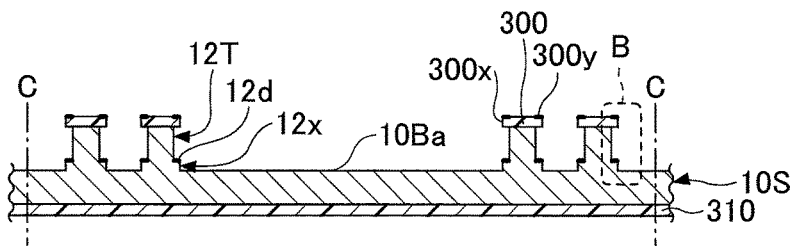
Figure 11C:
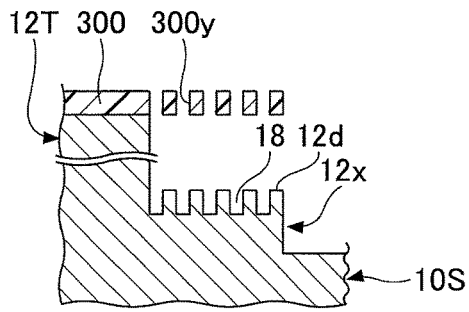
Figure 11D:
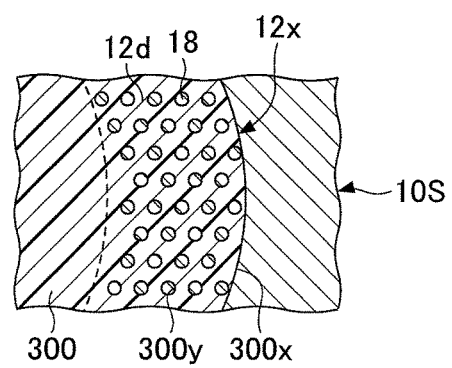

FIG. 10A is a plan view of a semiconductor device according to the second embodiment. FIG. 10B is a cross-sectional view of the semiconductor device, taken along a line A-A in FIG. 10A. FIG. 10C is an enlarged cross-sectional view of a part indicated by B ("part B") in FIG. 10B. FIG. 10D is an enlarged plan view of part of the part B in FIG. 10B. In FIG. 10A, the metal wires 30 and the resin 40 are not depicted for clarity. In FIG. 10D, the resin 40 is not depicted for clarity.

According to the semiconductor device 1 of the first embodiment (see FIGS. 1A through 1D), the step surface 12d of the lead 12 is substantially flush with the upper surface 11a of the die pad 11, and the deepest parts of the depressions of the uneven surface part 18 are substantially flush with the upper surface 11a of the die pad 11. According to a semiconductor device 2 of the second embodiment, the step surface 12d of the lead 12 is positioned higher (closer to the upper surface of the resin 40) than the upper surface 11a of the die pad 11, so that the step surface 12d and a portion of the side surface 12c of the lead 12 extending from the step surface 12d to the lower surface 12b are covered with the resin 40.

By thus positioning the step surface 12d higher than the upper surface 11a of the die pad 11, it is possible to prevent formation of a gap between the lead 12 and the resin 40 during the etchback process depicted in FIG. 9C. As a result, it is possible to make the entry pathway of moisture substantially even longer to further reduce the possibility that moisture may enter the interface between the side surface 12c of the lead 12 and the resin 40 to move deeper along the interface.

It is possible to position the step surface 12d higher than the upper surface 11a of the die pad 11 by reducing the size, reducing the pitch, or reducing both the size and the pitch of the openings 300y in the process depicted in FIGS. 5A through 5D of the first embodiment. That is, the step surface 12d can be positioned higher than the upper surface of a part of the plate 10B to become the die pad 11 by etching the plate 10B using the resists 300 and 310 as etching masks as depicted in FIGS. 11A through 11D. Referring to FIGS. 11A through 11D, the stepped part 12x where the side surface of the projection 12T is stepped to form an upper portion more distant from the upper surface 10Ba of the plate 10B and a lower portion closer to the upper surface 10Ba of the plate 10B and radially (laterally) outside the upper portion is formed in each of the projections 12T. The uneven surface part 18 is formed in the step surface 12d of the stepped part 12x. The step surface 12d and the lower portion of the side surface of the stepped part 12x are covered regions to be covered with the resin 40.

[c] Third Embodiment

According to the third embodiment, a lead includes two step surfaces. In the third embodiment, a description of the same configurations as those of the above-described embodiments may be omitted.

Figure 12A:
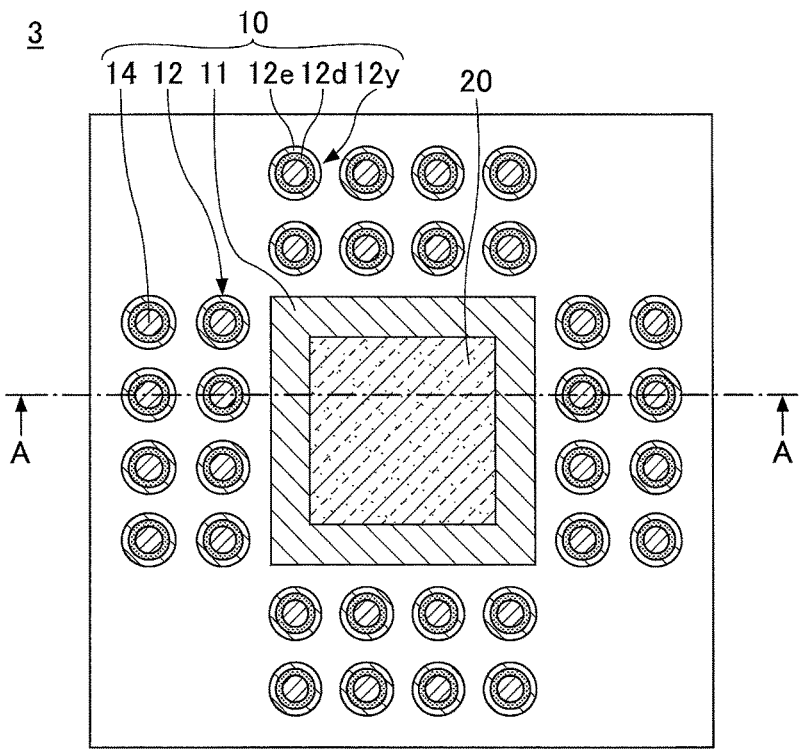
FIGS. 12A through 12D are diagrams depicting a semiconductor device according to a third embodiment.
Figure 12B:
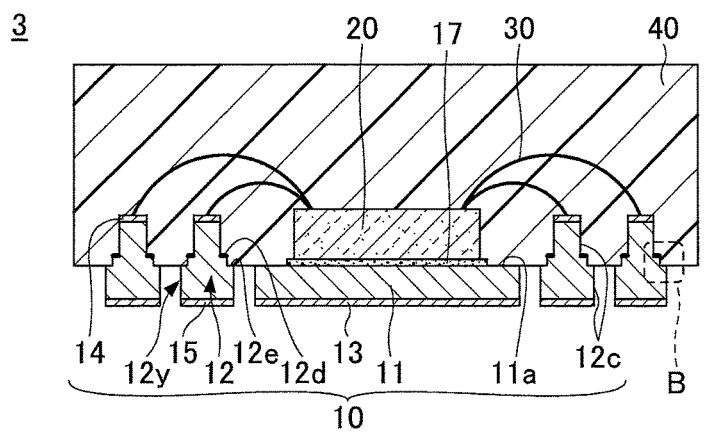
Figure 12C:
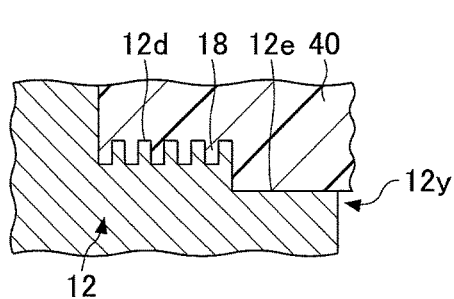
Figure 12D:
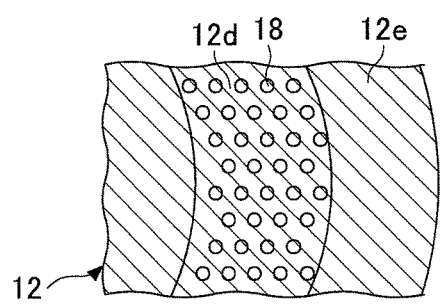

FIG. 12A is a plan view of a semiconductor device according to the third embodiment. FIG. 12B is a cross-sectional view of the semiconductor device, taken along a line A-A in FIG. 12A. FIG. 12C is an enlarged cross-sectional view of a part indicated by B ("part B") in FIG. 12B. FIG. 12D is an enlarged plan view of part of the part B in FIG. 12B. In FIG. 12A, the metal wires 30 and the resin 40 are not depicted for clarity. In FIG. 12D, the resin 40 is not depicted for clarity.

A semiconductor device 3 according to the third embodiment is different from the semiconductor device 2 according to the second embodiment in that two step surfaces, namely, the step surface 12d and a step surface 12e, are provided in a stepped part 12y of the lead 12. The step surface 12d is positioned higher than the upper surface 11a of the die pad 11 the same as in the semiconductor device 2.

The stepped part 12y is a portion of the lead 12 that is stepped twice to include the step surface 12e (additional step surface) positioned laterally outside the step surface 12d, and the step surfaces 12d and 12e are covered with the resin 40. To be more specific, the step surface 12e has a substantially annular shape to surround the step surface 12d in a plan view. The width (annular width) of the step surface 12e may be, for example, approximately 50 µm to approximately 75 µm. Referring to, for example, the cross-sectional view of FIG. 12B, the step surface 12e is positioned lower than the step surface 12d to be substantially flush with the upper surface 11a of the die pad 11. While the uneven surface part 18 is not formed in the step surface 12e, the uneven surface part 18 may be formed in the step surface 12e.

By thus providing the side surface 12c of the lead 12 with the stepped part 12y including multiple steps, it is possible to prevent formation of a gap between the lead 12 and the resin 40 during the etchback process depicted in FIG. 9C the same as in the semiconductor device 2 according to the second embodiment. Furthermore, the stepped part 12y makes it possible to make the entry pathway of moisture substantially even longer to further reduce the possibility that moisture may enter the interface between the side surface 12c of the lead 12 and the resin 40 to move deeper along the interface.

Figure 13A:
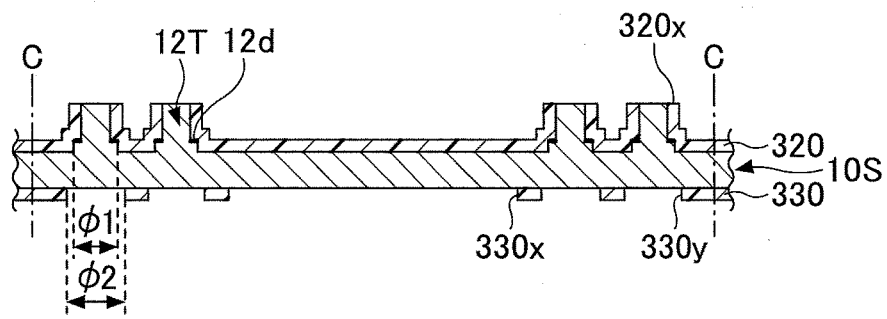
FIGS. 13A through 13C are diagrams depicting a process of manufacturing a semiconductor device according to the third embodiment.

The stepped part 12y including the step surfaces 12d and 12e may be formed by executing the process depicted in FIGS. 11A through 11D of the second embodiment and thereafter removing the resists 300 and 310 to execute the process depicted in FIG. 13A.

In the process depicted in FIG. 13A, the resists 320 and 330 are formed and the openings 320x, 330x, and 330y are formed in the resists 320 and 330 the same as in the process depicted in FIG. 7A of the first embodiment. When the step surface 12d (the formation region of the uneven surface part 18) has an annular shape whose outside diameter is φ1, a circular opening substantially concentric with the circular ring of the step surface 12d and having a diameter φ2 greater than the outside diameter φ1 of the step surface 12d is formed as each of the openings 330y.

Figure 13B:
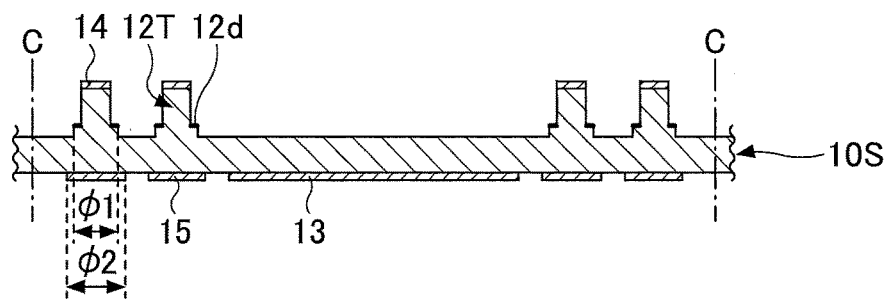

Next, the same processes as those of FIGS. 7B and 7C are executed to form the metal film 15 having the diameter φ2 at positions where the openings 330y have been provided on the lower surface of the leadframe 10S as depicted in FIG. 13B.

Figure 13C:
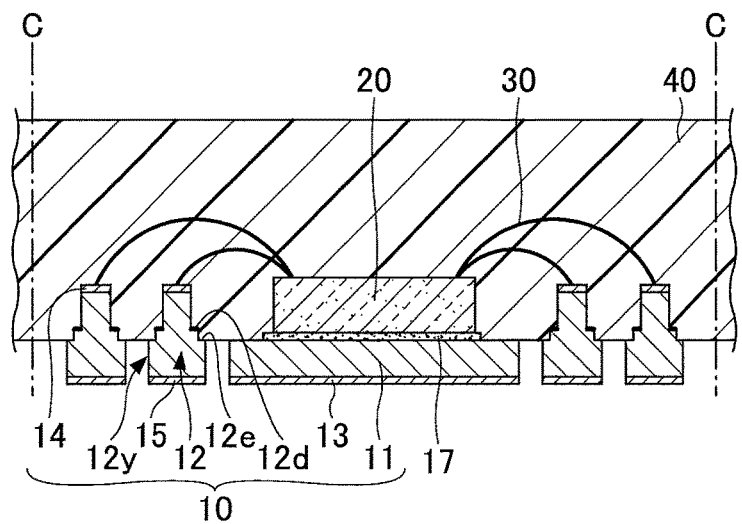

Next, the same processes as those of FIGS. 9A through 9C are executed to perform an etchback process, using the metal film 15 as an etching mask, so that the step surface 12e having a substantially annular shape is provided outside (around) the step surface 12d in a plan view as depicted in FIG. 13C. As a result, the stepped part 12y including the step surfaces 12d and 12e is formed in the lead 12.

[d] Fourth Embodiment

According to a fourth embodiment, an uneven surface part is formed in a surface of a die pad on which a semiconductor chip is to be mounted. In the fourth embodiment, a description of the same configurations as those of the above-described embodiments may be omitted.

Figure 14A:
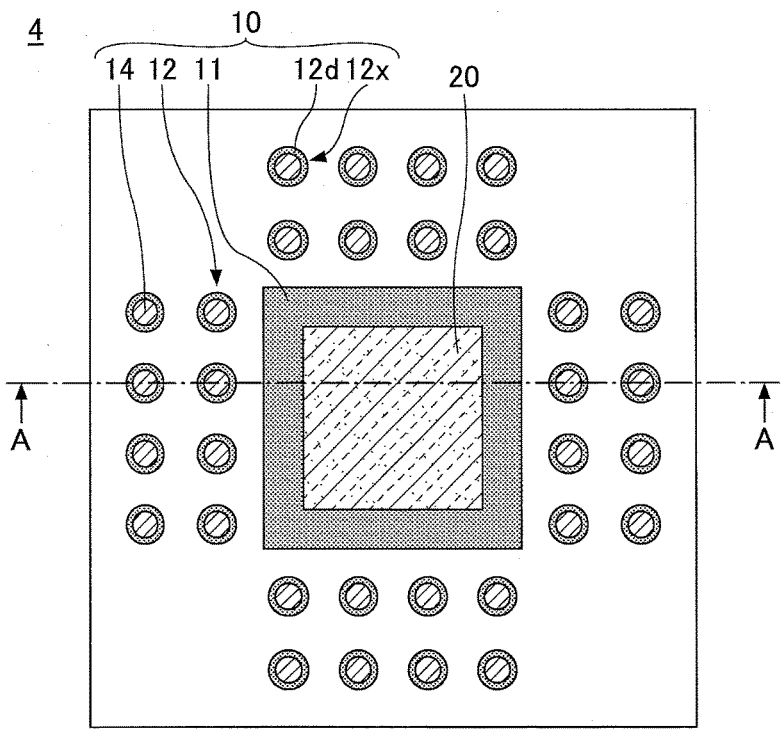
FIGS. 14A through 14D are diagrams depicting a semiconductor device according to a fourth embodiment.
Figure 14B:
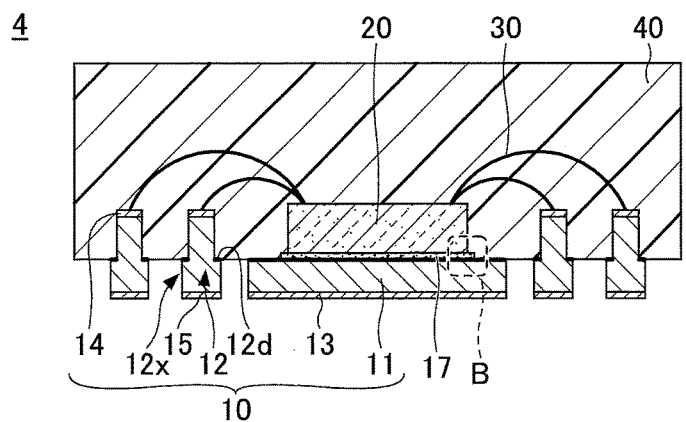
Figure 14C:
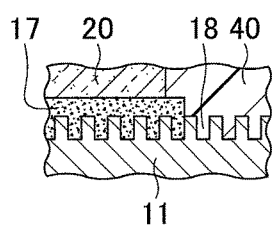
Figure 14D:
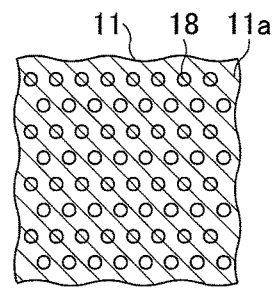
Figure 15A:
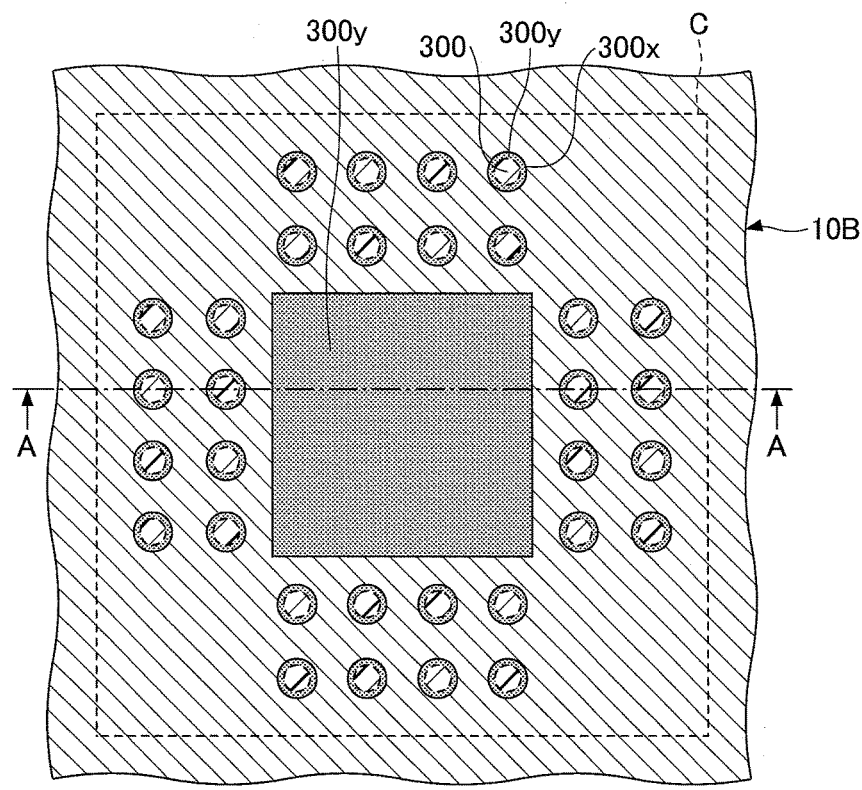
FIGS. 15A through 15D are diagrams depicting a process of manufacturing a semiconductor device according to the fourth embodiment.
Figure 15B:
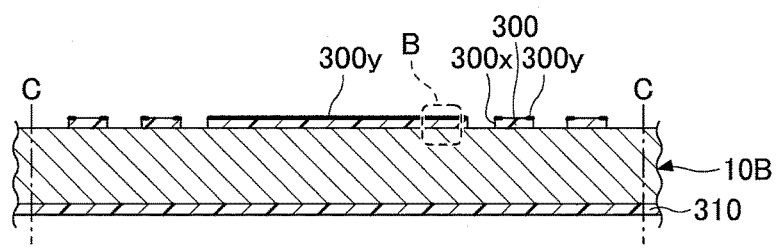
Figure 15C:
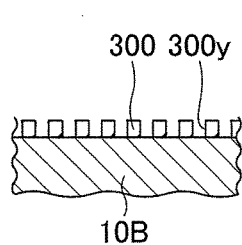
Figure 15D:
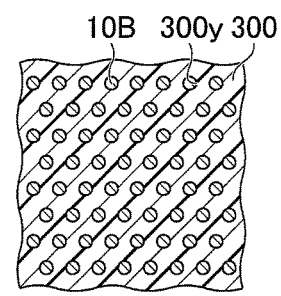

FIG. 14A is a plan view of a semiconductor device according to the fourth embodiment. FIG. 14B is a cross-sectional view of the semiconductor device, taken along a line A-A in FIG. 14A. FIG. 14C is an enlarged cross-sectional view of a part indicated by B ("part B") in FIG. 14B. FIG. 14D is an enlarged plan view of part of the part B in FIG. 14B. In FIG. 14A, the metal wires 30 and the resin 40 are not depicted for clarity. In FIG. 14D, the resin 40 is not depicted for clarity.

Referring to FIGS. 14A through 14D, a semiconductor device 4 according to the fourth embodiment is different from the semiconductor device 1 according to the first embodiment (see FIGS. 1A through 1D) in that the uneven surface part 18 is provided in the upper surface 11a of the die pad 11.

By thus providing the uneven surface part 18 in the upper surface 11a of the die pad 11, the following effects are produced in addition to the effects of the first embodiment. That is, it is possible to increase the adhesion between the upper surface 11a of the die pad 11 and the resin 40. Furthermore, it is possible to make the entry pathway of moisture substantially longer to reduce the possibility that moisture may enter the interface between the upper surface 11a of the die pad 11 and the resin 40 to move further inward along the interface. Furthermore, it is possible to increase the bonding strength of the semiconductor chip 20 bonded onto the upper surface 11a of the die pad 11 with the adhesive 17 through the anchoring effect of the adhesive 17.

To form the uneven surface part 18 in the upper surface 11a of the die pad 11, the process depicted in FIGS. 15A through 15D may be executed in lieu of the process depicted in FIGS. 4A through 4D of the first embodiment. The process depicted in FIGS. 15A through 15D is different from the process depicted in FIGS. 4A through 4D in that the resist 300 is patterned to include the openings 300y over a part of the plate 10B to become the die pad 11. Then, the same process as depicted in FIGS. 5A through 5D is executed to form the uneven surface part 18 around the projections 12T on the plate 10B and on the part of the plate 10B to become the die pad 11 (a chip mounting region). The subsequent processes are the same as in the first embodiment.

In the process depicted in FIGS. 15A through 15D, by changing one or more of the planar shape, the size, and the pitch of the openings 300y formed over the part of the plate 10B to become the die pad 11, the upper surface 11a of the die pad 11 can be formed flat by half-etching. That is, it is possible to perform half-etching without forming the uneven surface part 18. For example, it is possible to form a flat half-etched surface by causing the openings 300y formed over the part of the plate 10B to become the die pad 11 to form a checkered resist pattern. In this case, a semiconductor device having the same structure as the semiconductor device 1 depicted in FIGS. 1A through 1D can be manufactured, although in a different manufacturing process.

[Variations]

Variations of the embodiments are described. The variations may be applied to any of the above-described embodiments.

Figure 16:
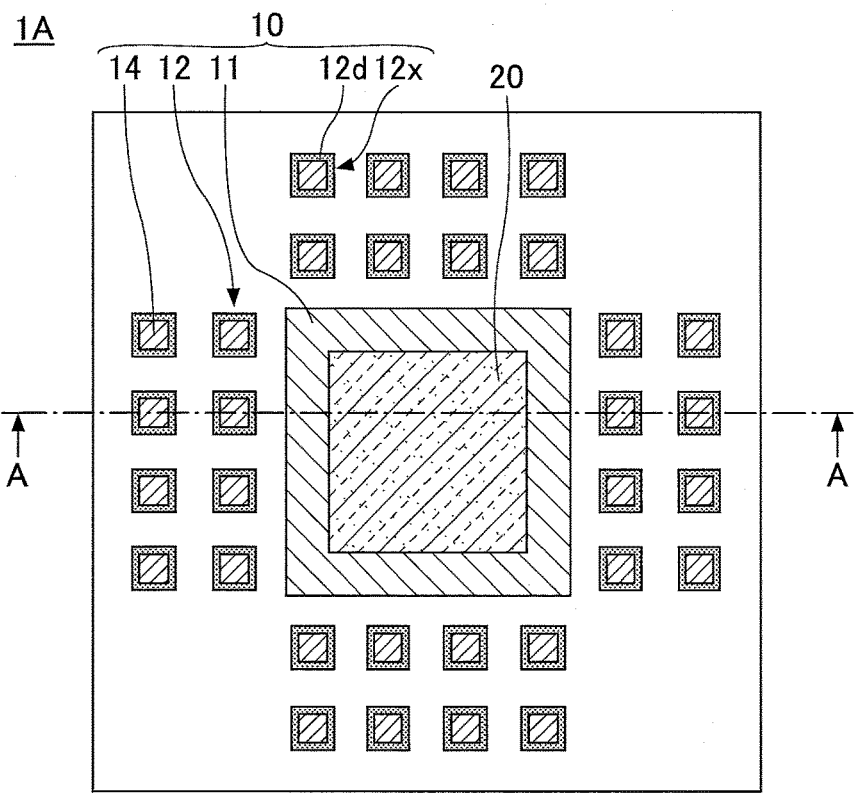
FIG. 16 is a diagram depicting a semiconductor device according to a first variation.

FIG. 16 is a diagram depicting a semiconductor device according to a first variation. According to a semiconductor device 1A depicted in FIG. 16, the lead 12 has a quadrangular prism shape. Thus, according to the semiconductor devices 1 through 4 of the above-described embodiments, the shape of the lead 12 is not limited to a cylindrical shape, and may be the shape of a prism such as a quadrangular prism or a hexagonal prism. A cross-sectional view of the semiconductor device 1A taken along a line A-A in FIG. 16 is the same as the cross-sectional view of FIG. 1B.

Figure 17:
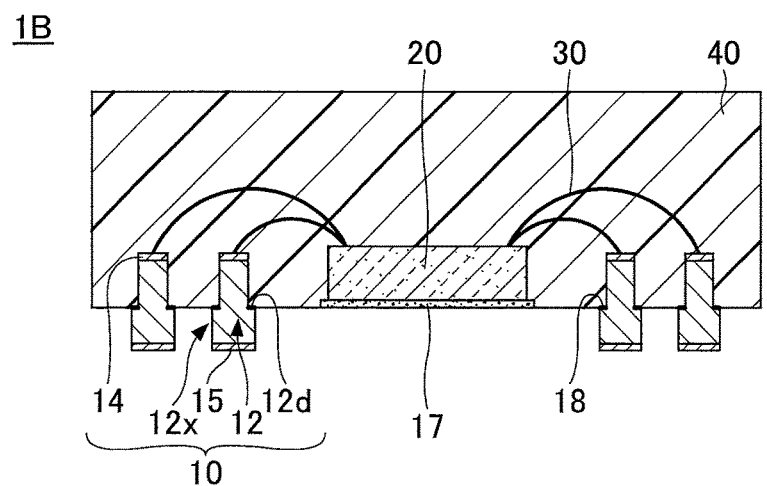
FIG. 17 is a diagram depicting a semiconductor device according to a second variation.

FIG. 17 is a diagram depicting a semiconductor device according to a second variation. A semiconductor device 1B depicted in FIG. 17 has no die pad. Like the semiconductor device 1B, the semiconductor devices 1 through 4 of the above-described embodiments may be without a die pad.

Figure 18A:
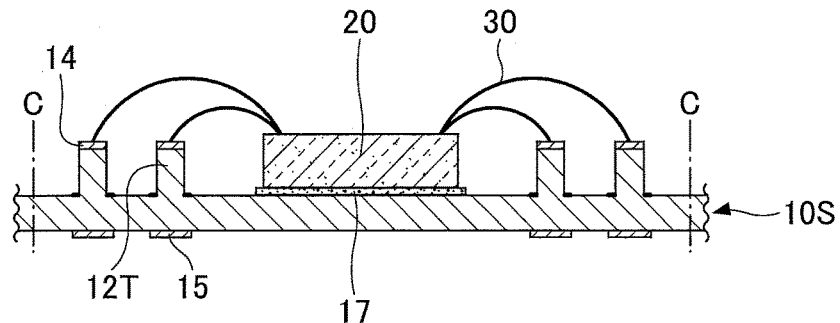
FIGS. 18A through 18C are diagrams depicting a process of manufacturing a semiconductor device according to the second variation.
Figure 18B:
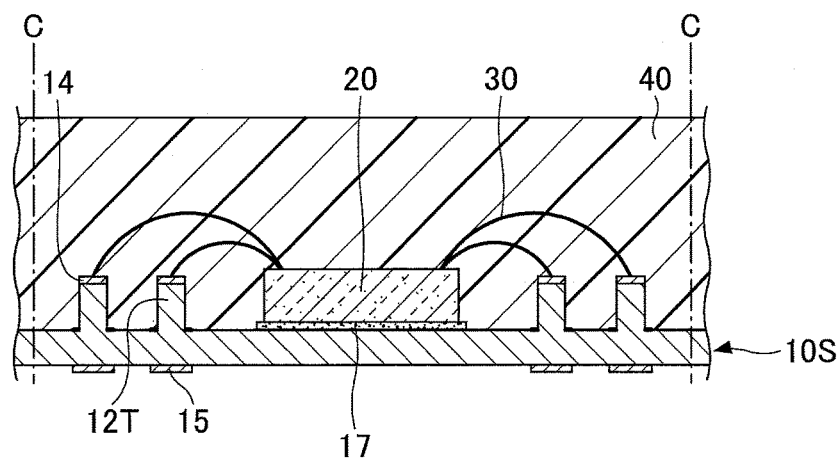
Figure 18C:
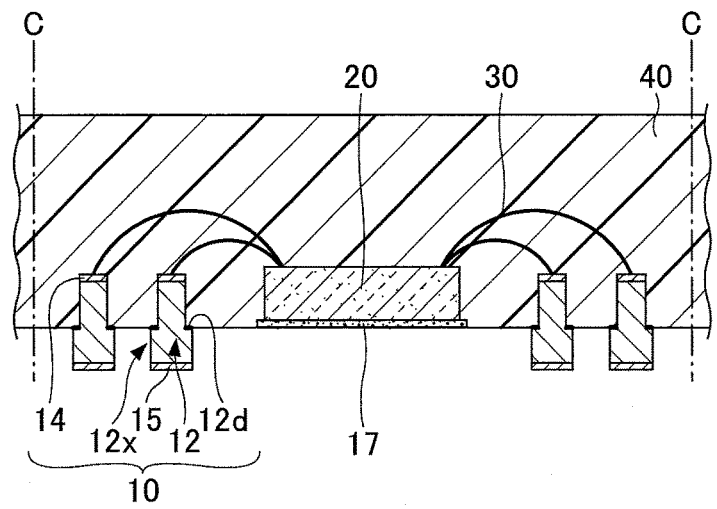

FIGS. 18A, 18B and 18C are diagrams depicting a process of manufacturing a semiconductor device according to the second variation. To manufacture the semiconductor device 1B, for example, in the process depicted in FIG. 7C of the first embodiment, only the metal films 14 and 15 are provided on a part of the leadframe 10S to become the leads 12, and the metal film 13 is not provided. Thereafter, as depicted in FIGS. 18A through 18C, the same processes as depicted in FIGS. 9A through 9C may be executed to manufacture the semiconductor device 13B with no die pad. In the process depicted in FIG. 18C, the lower surface of the semiconductor chip 20 (the lower surface of the adhesive 17) is exposed at the lower surface of the resin 40.

Figure 19A:
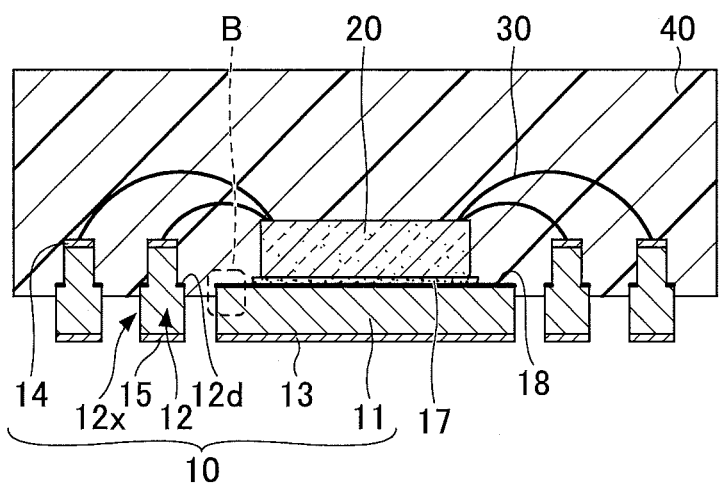
FIGS. 19A and 19B are diagrams depicting a semiconductor device according to a third variation.
Figure 19B:
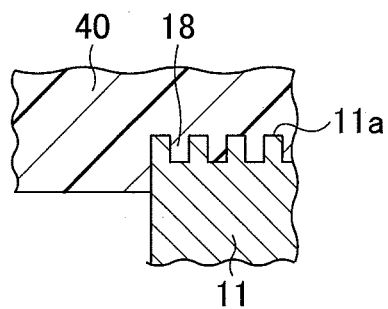

FIG. 19A is a cross-sectional view of a semiconductor device according to a third variation. FIG. 19B is an enlarged cross-sectional view of a part indicated by B in FIG. 19A. According to a semiconductor device 1C depicted in FIGS. 19A and 19B, the upper surface 11a and a portion adjoining to the upper surface 11a of each side surface of the die pad 11 are covered with the resin 40, and the uneven surface part 18 is formed in the upper surface 11a of the die pad 11.

Figure 20A:
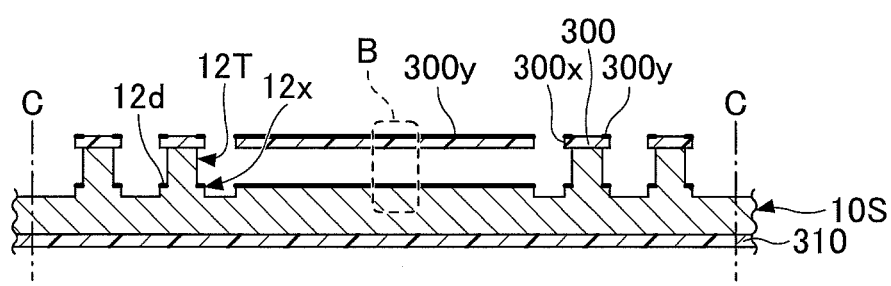
FIGS. 20A and 20B are diagrams depicting a process of manufacturing a semiconductor device according to the third variation.
Figure 20B:
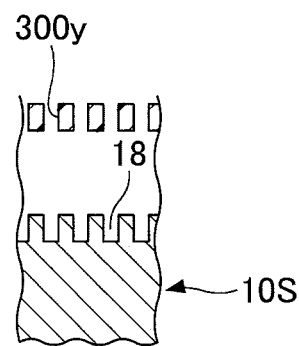

FIGS. 20A and 20B are diagrams depicting a process of manufacturing a semiconductor device according to the third variation. FIG. 20B is an enlarged cross-sectional view of a part indicated by B in FIG. 20A. To manufacture the semiconductor device 1C, for example, in the process depicted in FIGS. 11A through 11D of the second embodiment, etching may be performed with the resist 300 patterned to include the openings 300y over a part of the plate 10B to become the die pad 11. As a result, as depicted in FIGS. 20A and 20B, the uneven surface part 18 is formed in the upper surface of the part to become the die pad 11, and the upper surface of the part to become the die pad 11 is etched to be substantially flush with the step surfaces 12d.

Figure 21A:
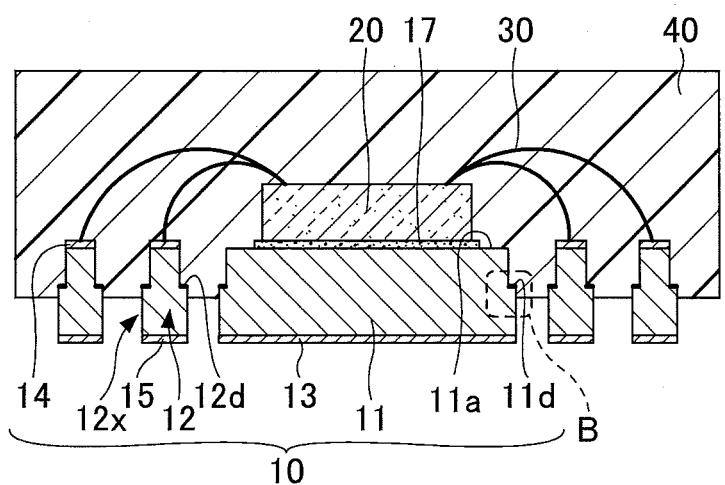
FIGS. 21A and 21B are diagrams depicting a semiconductor device according to a fourth variation.
Figure 21B:
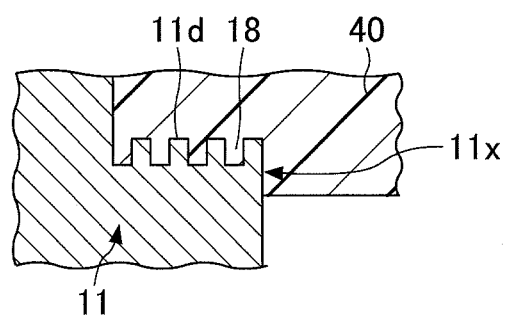

FIG. 21A is a cross-sectional view of a semiconductor device according to a fourth variation. FIG. 21B is an enlarged cross-sectional view of a part indicated by B in FIG. 21A. According to a semiconductor device 1D depicted in FIGS. 21A and 21B, the upper surface 11a and a portion adjoining to the upper surface 11a of each side surface of the die pad 11 are covered with the resin 40, the side surfaces of the die pad 11 are stepped to form a step surface 11d, and the uneven surface part 18 is formed in the step surface 11d.

Figure 22A:
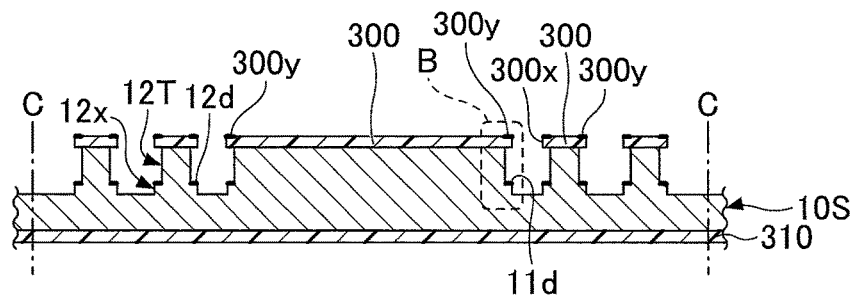
FIGS. 22A and 22B are diagrams depicting a process of manufacturing a semiconductor device according to the fourth variation.
Figure 22B:
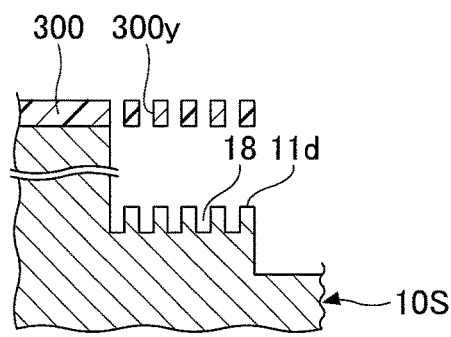

FIGS. 22A and 22B are diagrams depicting a process of manufacturing a semiconductor device according to the fourth variation. FIG. 22B is an enlarged cross-sectional view of a part indicated by B in FIG. 22A. To manufacture the semiconductor device 1D, for example, in the process depicted in FIGS. 11A through 11D of the second embodiment, etching may be performed with the resist 300 patterned to include the openings 300y around the upper surface of a part of the plate 10B to become the die pad 11 in a plan view. As a result, as depicted in FIGS. 22A and 22B, a portion of the plate 10B around the upper surface of the part to become the die pad 11 is etched to form the step surface 11d substantially flush with the step surfaces 12d. Furthermore, the uneven surface part 18 is formed in the step surface 11d.

Figure 23:
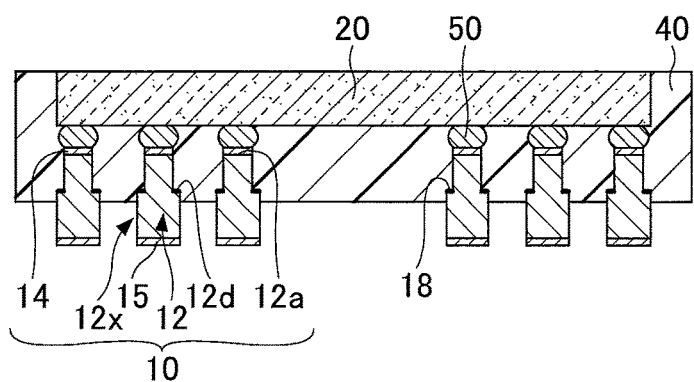
FIG. 23 is a diagram depicting a semiconductor device according to a fifth variation.

FIG. 23 is a cross-sectional view of a semiconductor device according to a fifth variation. A semiconductor device 1E depicted in FIG. 23 includes the leads 12 but has no die pad. The semiconductor chip 20 is connected face down (by flip chip bonding) to the metal film 14 on the upper surfaces 12a of the leads 12 via bumps 50. In this case, the rear surface (upper surface in FIG. 23) of the semiconductor chip 20 may be exposed at the upper surface of the resin 40 to reduce the thickness of the semiconductor device LE and to increase the heat dissipation of the semiconductor chip 20. The rear surface of the semiconductor chip 20, however, may be covered with the resin 40.

Figure 24:
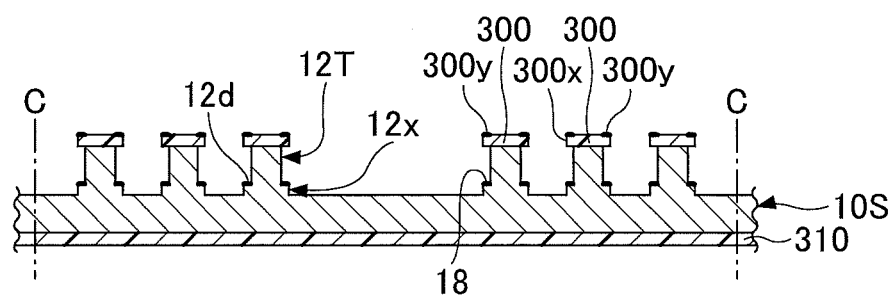
FIG. 24 is a diagram depicting a process of manufacturing a semiconductor device according to the fifth variation.

FIG. 24 is a diagram depicting a process of manufacturing a semiconductor device according to the fifth variation. To manufacture the semiconductor device 1E, for example, as depicted in FIG. 24, etching may be performed with the resist 300 for forming only the leads 12 the same as in the process depicted in FIGS. 11A through 11D. Thereafter, the resist 300 is removed, and the metal films 14 and 15 are provided on a part to become the leads 12 while the metal film 13 is not provided the same as in the process depicted in FIG. 18A. Then, the semiconductor chip 20 is mounted face down on the metal film 14 by flip chip bonding. Then, the same processes as those of FIGS. 18B and 18C may be executed to complete the semiconductor device 1E that includes the leads 12 but has no die pad.

Figure 25:
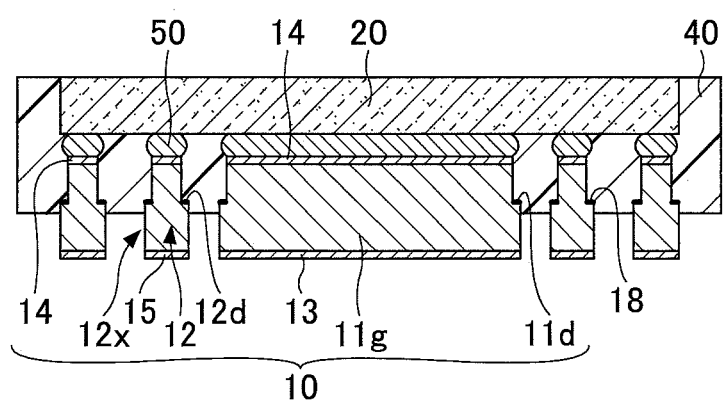
FIG. 25 is a diagram depicting a semiconductor device according to a sixth variation.

FIG. 25 is a cross-sectional view of a semiconductor device according to a sixth variation. A semiconductor device 1F depicted in FIG. 25 includes a lead 11g at a position corresponding to the die pad 11 in FIG. 23. Furthermore, the metal film 14 is formed on the upper surface of the lead 11g to be connected to the semiconductor chip 20 via the bump 50. In this case, the lead 11g may be used as a ground lead or a power supply lead. Furthermore, the step surface 11d is formed in the lead 11g to be substantially flush with the step surface 12d of the lead 12, and the uneven surface part 18 is formed in the step surface 11d.

Figure 26A:
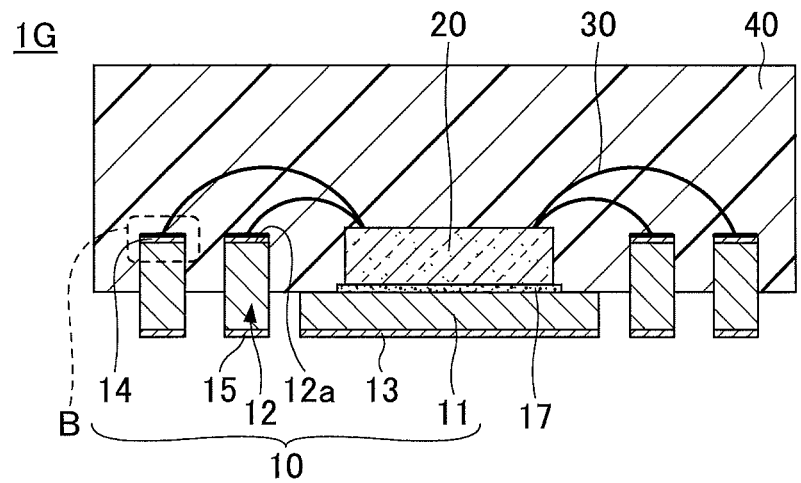
FIGS. 26A and 26B are diagrams depicting a semiconductor device according to a seventh variation.
Figure 26B:
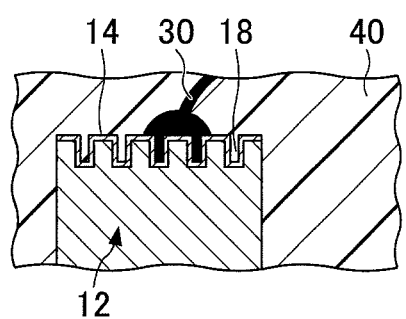

FIG. 26A is a cross-sectional view of a semiconductor device according to a seventh variation. FIG. 26B is an enlarged cross-sectional view of a part indicated by B in FIG. 26A. A semiconductor device 1G depicted in FIG. 26, the uneven surface part 18 is formed in the upper surface 12a of the lead 12, and the metal film 14 is formed on and along the uneven surface of the uneven surface part 18.

Figure 27A:
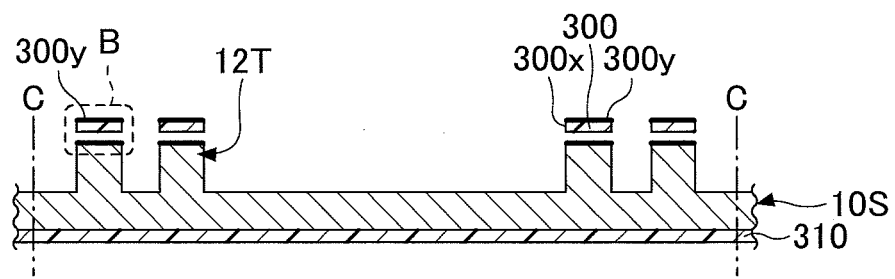
FIGS. 27A and 27B are diagrams depicting a process of manufacturing a semiconductor device according to the seventh variation.
Figure 27B:
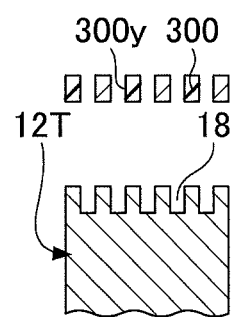

FIGS. 27A and 27B are diagrams depicting a method of manufacturing a semiconductor device according to the seventh variation. FIG. 27B is an enlarged cross-sectional view of a part indicated by B in FIG. 27A. To manufacture the semiconductor device 1G, for example, the process depicted in FIGS. 5A through 5D of the first embodiment may be replaced by etching with the resist 300 patterned to include the openings 300y over the entire part to become the projections 12T as depicted in FIGS. 27A and 27B.

Figure 28A:
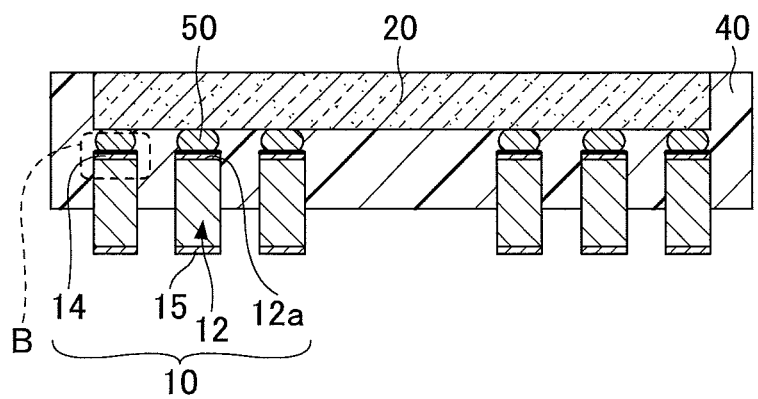
FIGS. 28A and 28B are diagrams depicting a semiconductor device according to an eighth variation.
Figure 28B:
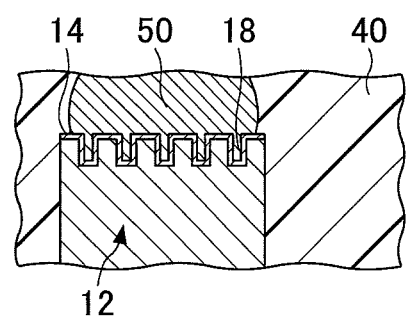

FIG. 28A is a cross-sectional view of a semiconductor device according to an eighth variation. FIG. 28B is an enlarged cross-sectional view of a part indicated by B in FIG. 28A. A semiconductor device 1H depicted in FIGS. 28A and 28B is formed by forming the uneven surface part 18 in the entire upper surface 12a of the lead 12 of the semiconductor device 1E depicted in FIG. 23. As in the semiconductor device 1G depicted in FIGS. 26A and 26B, the uneven surface part 18 is formed in the entire upper surface 12a of the lead 12, and the metal film 14 is formed on and along the uneven surface of the uneven surface part 18.

Figure 29A:
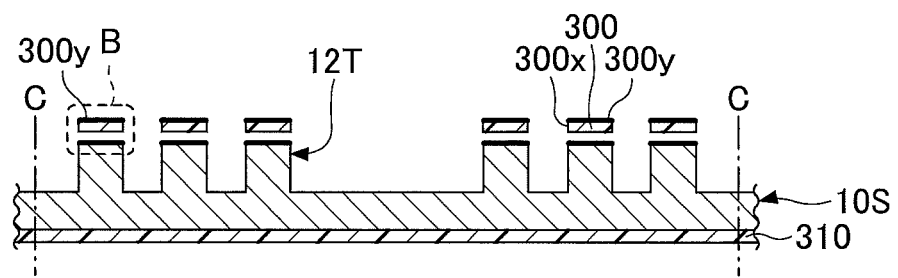
FIGS. 29A and 29B are diagrams depicting a process of manufacturing a semiconductor device according to the eighth variation.
Figure 29B:
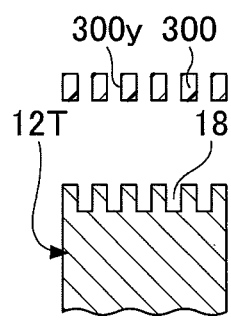

FIGS. 29A and 29B are diagrams depicting a process of manufacturing a semiconductor device according to the eighth embodiment. FIG. 29B is an enlarged cross-sectional view of a part indicated by B in FIG. 29A. To manufacture the semiconductor device 1H, for example, as depicted in FIGS. 29A and 29B, etching may be performed with the resist 300 patterned to include the openings 300y over the entire part to become the projections 12T. Thereafter, the resist 300 is removed, and the metal films 14 and 15 are provided on a part to become the leads 12 while the metal film 13 is not provided the same as in the process depicted in FIG. 18A. Then, the semiconductor chip 20 is mounted face down on the metal film 14 by flip chip bonding. Then, the same processes as those of FIGS. 18B and 18C may be executed to complete the semiconductor device 1H that includes the leads 12 but has no die pad.

Example 1

Figure 30A:
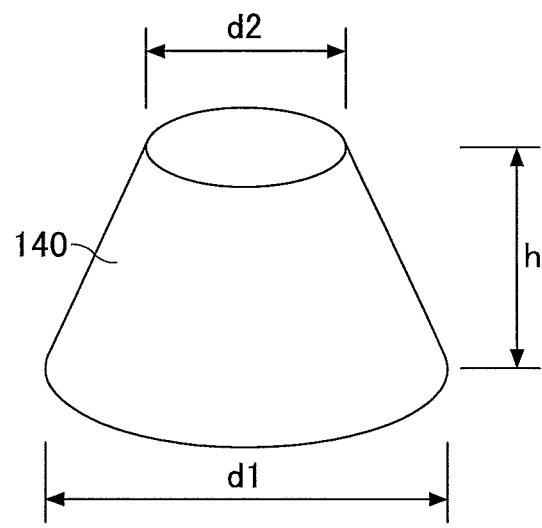
FIGS. 30A and 30B are diagrams depicting a test sample for a cup shear test.
Figure 30B:
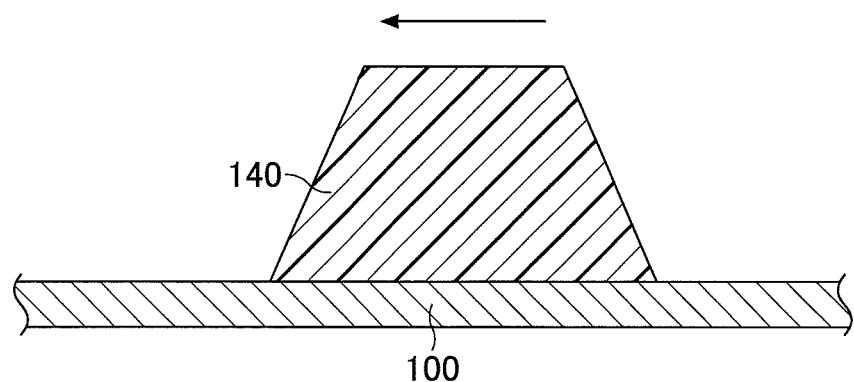

First, test samples as depicted in FIGS. 30A and 30B were made. Specifically, an uneven surface part including depressions each having a planar shape of a circle more than or equal to 0.020 mm and less than or equal to 0.060 mm in diameter was formed in an upper surface of a leadframe material 100 that is a flat metal plate formed of copper. A resin cup 140 was then formed on the uneven surface part under the conditions of formation indicated in TABLE 1 below without plating a surface of the uneven surface part. With respect to each of six S ratios, six test samples were made, and a measurement was conducted six times. An S ratio of 1 indicates test samples without an uneven surface part (conventional products serving as a comparative example). In determining an S ratio, a surface area was measured using a laser confocal microscope (LEXT OLS4100, a product of OLYMPUS CORPORATION).

TABLE 1

| RESIN TYPE | EPOXY RESIN |
|---|---|
| HEIGHT h | 3 mm |
| BOTTOM DIAMETER d1 | 3.568 mm |
| TOP DIAMETER d2 | 3 mm |
| SURFACE AREA | 10.2 mm$^2$ |
| THERMAL HISTORY | 175° C. × 1 h (N$_2$) + 230° C. × 10 min. (AIR) |
| RESIN CURING CONDITION | 175° C. × 6 h (AIR) |

As indicated in TABLE 1, the test samples were heated at 175° C. for 1 hour in a nitrogen atmosphere, and were thereafter heated at 230° C. for 10 minutes in the air as a thermal history. The thermal history assumes heating in a semiconductor chip mounting process (die attach process) and a wire bonding process performed before encapsulating a semiconductor chip, etc., in resin during a manufacturing process from the manufacture of a leadframe to the manufacture of a semiconductor device.

That is, the leadframe is oxidized to no small extent by heating in these processes to affect the adhesive force between resin and the leadframe. Therefore, in this test as well, the resin cup 140 was formed after adding a thermal history corresponding to heating in the actual die attach process and wiring bonding process to the leadframe materials 100 of the test samples. As a result, it is possible to obtain highly reliable test results.

Next, a cup shear test was conducted following the procedure provided by the SEMI G69-0996 standard. Specifically, a gauge (not depicted) was pressed against the resin cup 140 of each test sample to be moved in the direction of an arrow in FIG. 30B to measure the shear strength. The test was conducted at room temperature (approximately 25° C.). The height of the gauge was 20 μm and the speed of the gauge was 200 μm/s.

Figure 31:
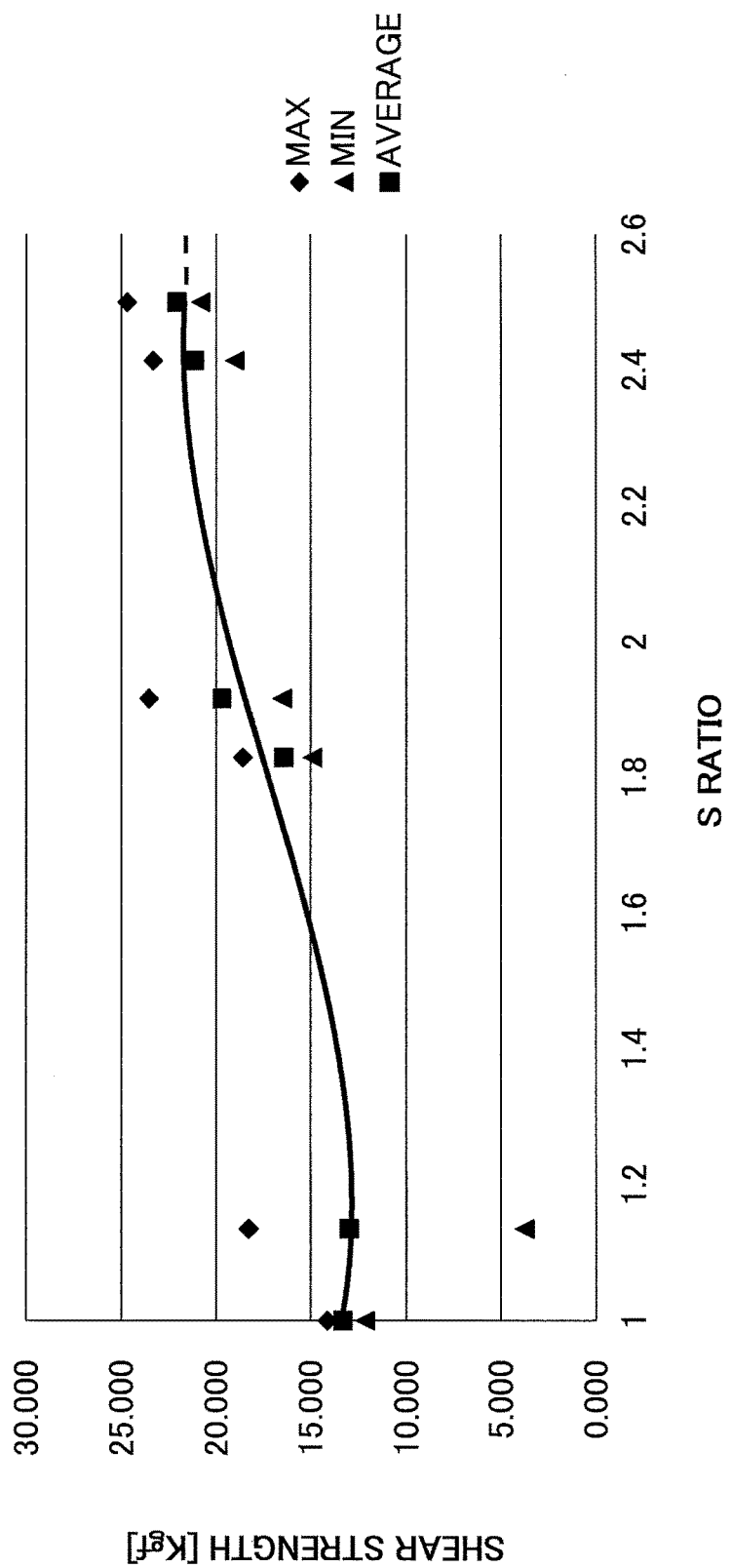
FIG. 31 is a graph indicating the results of a cup shear test according to Example 1.

FIG. 31 indicates the test results. Referring to FIG. 31, while the shear strength of the test samples (S ratio=1) of the comparative example is approximately 13 [Kgf] on average, the shear strength of the test samples having an S ratio of 1.8 or more is 17 [Kgf] or more on average. That is, it has been found that the adhesion between the leadframe and resin significantly increases compared with the conventional products when the S ratio is 1.8 or more. When the S ratio is approximately 2.5, an increase in the shear strength saturates. This is because part of the resin comes off (breaks) before delamination of the leadframe and the resin at their interface.

Example 2

The same uneven surface part as in Example 1 was formed in the upper surface of the copper leadframe material 100, and a cup shear test was conducted in the same manner as in Example 1 except that the surface of the uneven surface part was plated with silver and the resin cup 140 was formed on the silver-plated uneven surface part. The thickness of the silver plating film was approximately 6 μm.

Figure 32:
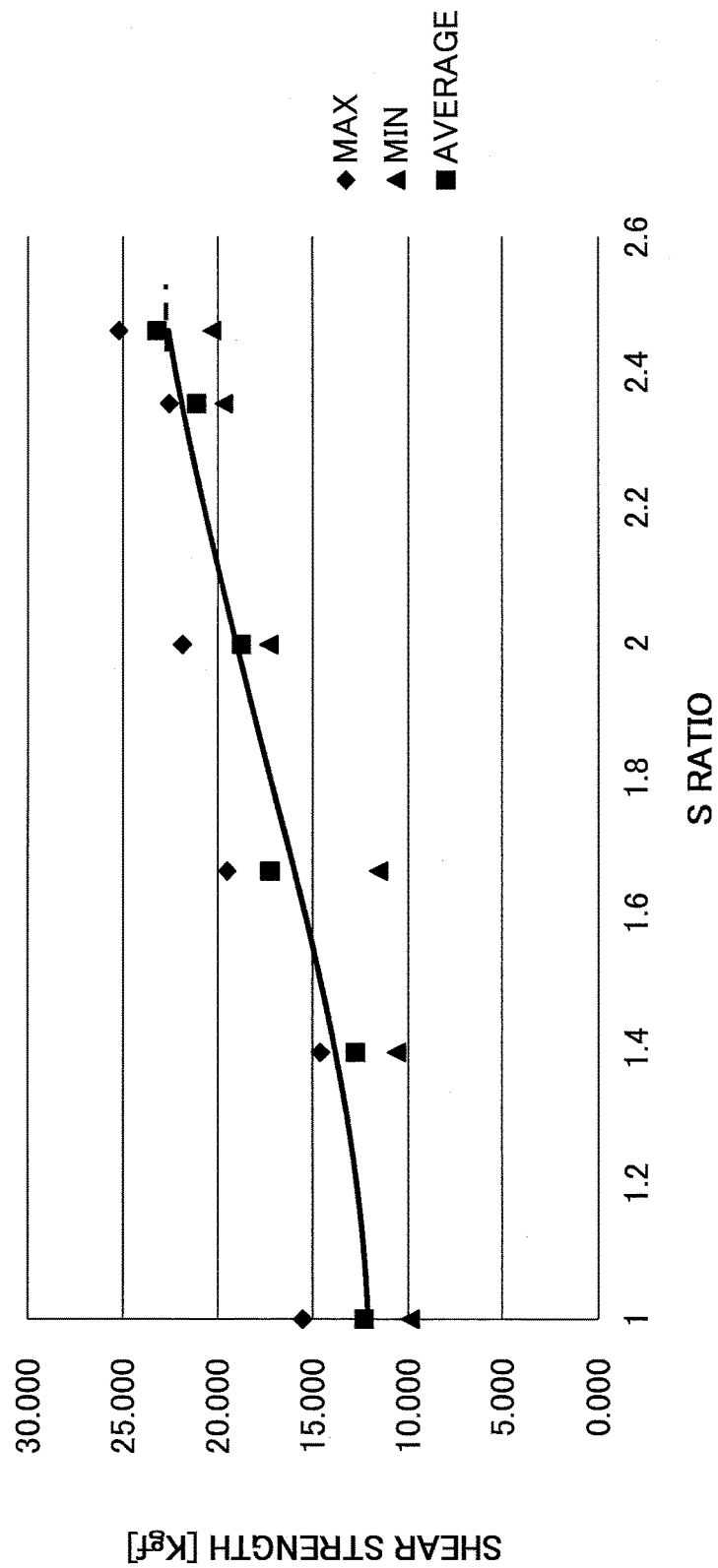
FIG. 32 is a graph indicating the results of a cup shear test according to Example 2.

FIG. 32 indicates the test results. Referring to FIG. 32, while the shear strength of the test samples (S ratio=1) of the comparative example is approximately 13 [Kgf] on average, the shear strength of the test samples having an S ratio of 1.7 or more is 17 [Kgf] or more on average. That is, it has been found that the adhesion between the sliver plating film formed on the leadframe and resin significantly increases compared with the conventional products when the S ratio is 1.7 or more.

Example 3

The same uneven surface part as in Example 1 was formed in the upper surface of the copper leadframe material 100, and a cup shear test was conducted in the same manner as in Example 1 except that the surface of the uneven surface part was plated with Ni/Pd/Au and the resin cup 140 was formed on the Ni/Pd/Au-plated uneven surface part.

The Ni/Pd/Au plating is a laminate of a Ni plating film, a Pd plating film, and a Au plating film stacked on the upper surface of the leadframe material 100 in this order. According to Example 3, the thickness of the Ni plating film was approximately 0.8 μm, the thickness of the Pd plating film was approximately 0.03 μm, and the thickness of the Au plating film was approximately, 0.006 μm.

Figure 33:
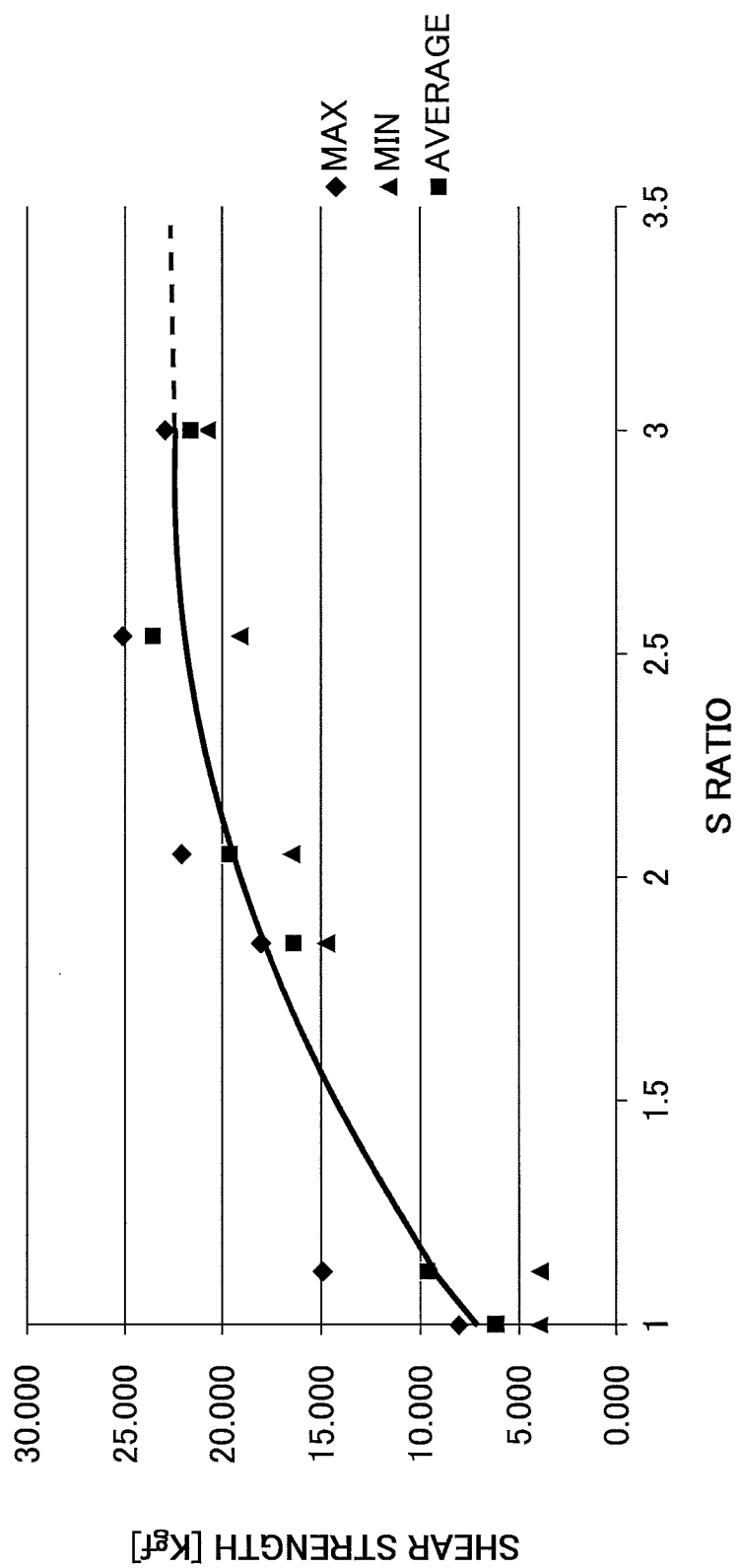
FIG. 33 is a graph indicating the results of a cup shear test according to Example 3.

FIG. 33 indicates the test results. Referring to FIG. 33, while the shear strength of the test samples (S ratio=1) of the comparative example is approximately 6 [Kgf] on average, the shear strength of the test samples having an S ratio of 1.8 or more is 17 [Kgf] or more on average. That is, it has been found that the adhesion between the Ni/Pd/Au plating film formed on the leadframe and resin significantly increases compared with the conventional products when the S ratio is 1.8 or more.

Summary of Examples

By forming an uneven surface part that includes depressions having a planar shape of a circle more than or equal to 0.020 mm and less than or equal to 0.060 mm in diameter to have an S ratio of 1.7 or more in an upper surface of a copper leadframe, the surface area of a part of the leadframe that contacts resin increases. Therefore, the anchoring effect is produced to make it possible to increase the adhesion between the leadframe and resin.

Furthermore, the uneven surface part can maintain the S ratio at a certain level or higher even after being plated with silver or Ni/Pd/Au. Therefore, even in the case of providing resin on the plated surface of the leadframe, it is possible to increase the adhesion between the leadframe and resin.

A range of S ratios suitable for practical use is from approximately 1.7 to approximately 2.5. In view of the adhesion increasing effect and the saturation of an increase in adhesion, a more suitable range of S ratios is from approximately 1.8 to approximately 2.0.

The same effect has been confirmed with the case where the planar shape of depressions in the uneven surface part is a polygon whose circumcircle has a diameter of greater than or equal to 0.020 mm and smaller than or equal to 0.060 mm.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, two or more the above-described embodiments and variations may be used in combination as desired.

Various aspects of the subject-matter described herein may be set out non-exhaustively in the following numbered clauses:

1. A semiconductor device, including:
a leadframe including a terminal having a pillar shape, the terminal including a first end surface and a second end surface facing away from the first end surface, the first end surface having an uneven surface part formed therein;
a semiconductor chip mounted on the leadframe; and
an encapsulation resin covering the leadframe and the semiconductor chip,
wherein a first portion of the terminal extending from the first end surface toward the second end surface is covered with the encapsulation resin, and a second portion of the terminal extending from the first portion to the second end surface projects from the encapsulation resin.

2. A leadframe, including:
a plate member including a surface partly projecting to form a projection having a pillar shape to serve as a connection terminal,
wherein the surface of the plate member is stepped to form another projection around the projection, and
the projection and the other projection are in a region to be covered with an encapsulation resin in the surface of the plate member.

3. A leadframe, including:
a plate member including a surface partly projecting to form a projection having a pillar shape to serve as a connection terminal,
wherein an uneven surface part is formed in the surface of the plate member at a top of the projection, and
the projection is in a region to be covered with an encapsulation resin in the surface of the plate member.

4. A method of manufacturing a leadframe, the method including:
etching a metal plate to form a projection having a pillar shape at a surface of the metal plate and form an uneven surface part in the surface of the metal plate around the projection,
wherein the uneven surface part is formed in a region to be covered with an encapsulation resin in the surface of the plate member.

5. The method of manufacturing a leadframe of clause 4, wherein
a planar shape of each of depressions of the uneven surface part is a circle whose diameter is greater than or equal to 0.020 mm and smaller than or equal to 0.060 mm or a polygon whose circumcircle has a diameter of greater than or equal to 0.020 mm and smaller than or equal to 0.060 mm, and
a ratio of a surface area of the uneven surface part to a surface area of a planar surface in a case of forming the uneven surface part in the planar surface is 1.7 or more.

6. The method of manufacturing a leadframe of clause 4, further including:
forming a metal film on another surface of the metal plate facing away from the surface, so that the metal film covers a region of the other surface that coincides with a region of the surface where the projection and the uneven surface part are formed when viewed in a direction perpendicular to the other surface.

7. A method of manufacturing a semiconductor device, including:
preparing a leadframe that includes a projection having a pillar shape, formed at a first surface of the leadframe, an uneven surface part formed in the first surface around the projection, and a metal film formed in a region of a second surface of the leadframe facing away from the first surface, the region coinciding with the projection and the uneven surface part when viewed in a direction perpendicular to the second surface;
mounting a semiconductor chip on the first surface of the leadframe;
electrically connecting the semiconductor chip to the projection;
forming an encapsulation resin on the first surface of the leadframe to cover the projection and the semiconductor chip with the encapsulation resin;
etching the leadframe from the second surface, using the metal film as a mask, to form a connection terminal having a pillar shape, the connection terminal including a first end surface and a second end surface facing away from the first end surface, wherein a first portion of the connection terminal extending from the first end surface toward the second end surface is covered with the encapsulation resin, and a second portion of the connection terminal extending from the first portion to the second end surface projects from the encapsulation resin.

What is claimed is:

1. A semiconductor device, comprising:
a leadframe including a terminal having a pillar shape, the terminal including a first end surface, a second end surface facing away from the first end surface, and a side surface extending vertically between the first end surface and the second end surface, the side surface being stepped to form a step surface facing away from the second end surface and having an uneven surface part formed therein;
a semiconductor chip mounted on the leadframe; and
an encapsulation resin covering the leadframe and the semiconductor chip,
wherein a first portion of the terminal extending from the first end surface toward the second end surface and including the step surface is covered with the encapsulation resin, and a second portion of the terminal extending from the first portion to the second end surface projects from the encapsulation resin, and
wherein a planar shape of each of depressions of the uneven surface part is a circle whose diameter is greater than or equal to 0.020 mm and smaller than or equal to 0.060 mm or a polygon whose circumcircle has a diameter of greater than or equal to 0.020 mm and smaller than or equal to 0.060 mm.

2. The semiconductor device as claimed in claim 1, wherein the first portion of the terminal includes a portion of the side surface extending from the step surface toward the second end surface.

3. The semiconductor device as claimed in claim 1, wherein
the side surface of the terminal is further stepped to form an additional step surface, the additional step surface being positioned laterally outside the step surface, and the first portion of the terminal further includes the additional step surface.

4. The semiconductor device as claimed in claim 1, wherein
the leadframe further includes a chip mounting surface on which the semiconductor chip is mounted, and
the uneven surface part is further formed in the chip mounting surface.

5. The semiconductor device as claimed in claim 1, wherein a ratio of a surface area of the uneven surface part to a surface area of a planar surface in a case of forming the uneven surface part in the planar surface is 1.7 or more.

6. A leadframe, comprising:
a plate member including a surface partly projecting to form a projection having a pillar shape to serve as a connection terminal,
wherein an uneven surface part is formed in the surface of the plate member around the projection,
wherein the projection and the uneven surface part are in a region to be covered with an encapsulation resin in the surface of the plate member, and
wherein a planar shape of each of depressions of the uneven surface part is a circle whose diameter is greater than or equal to 0.020 mm and smaller than or equal to 0.060 mm or a polygon whose circumcircle has a diameter of greater than or equal to 0.020 mm and smaller than or equal to 0.060 mm.

7. The leadframe as claimed in claim 6, wherein
the surface of the plate member is stepped to form another projection around the projection, and
the uneven surface part is formed in the surface of the plate member at said another projection.

8. The leadframe as claimed in claim 7, further comprising:
a metal film formed on another surface of the plate member facing away from the surface, to cover a region of said another surface that coincides with the projection and said another projection when viewed in a direction perpendicular to said another surface.

9. The leadframe as claimed in claim 6, wherein
the surface of the plate member includes a chip mounting region for mounting a semiconductor chip, and
the uneven surface part is further formed in the chip mounting region.

10. The leadframe as claimed in claim 6, wherein a ratio of a surface area of the uneven surface part to a surface area of a planar surface in a case of forming the uneven surface part in the planar surface is 1.7 or more.

* * * * *